(12) United States Patent
Yamazaki et al.

(10) Patent No.: US 7,744,438 B2
(45) Date of Patent: Jun. 29, 2010

(54) PRODUCTION APPARATUS AND METHOD OF PRODUCING A LIGHT-EMITTING DEVICE BY USING THE SAME APPARATUS

(75) Inventors: Shunpei Yamazaki, Tokyo (JP); Takashi Hamada, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 445 days.

(21) Appl. No.: 11/717,815

(22) Filed: Mar. 14, 2007

(65) Prior Publication Data

US 2007/0218797 A1    Sep. 20, 2007

Related U.S. Application Data

(62) Division of application No. 10/614,565, filed on Jul. 7, 2003, now Pat. No. 7,204,735.

(30) Foreign Application Priority Data

Jul. 9, 2002    (JP)    ............... 2002-200379

(51) Int. Cl.
*H01J 9/00*    (2006.01)
(52) U.S. Cl. .................. 445/24; 427/66; 427/466
(58) Field of Classification Search ............. 445/23–25, 445/58; 427/46, 466; 438/29
See application file for complete search history.

(56) References Cited

U.S. PATENT DOCUMENTS

| 3,060,429 | A | 10/1962 | Winston |
| 3,147,142 | A | 9/1964 | Rudo |
| 3,416,153 | A | 12/1968 | Hertz et al. |
| 3,596,275 | A | 7/1971 | Sweet |
| 3,747,120 | A | 7/1973 | Stemme |
| 3,946,398 | A | 3/1976 | Kyser et al. |
| 4,138,284 | A | 2/1979 | Postupack |
| 4,226,182 | A | 10/1980 | Danielsen et al. |
| 4,620,196 | A | 10/1986 | Hertz et al. |
| 5,247,190 | A | 9/1993 | Friend et al. |
| 5,264,376 | A | 11/1993 | Abbott et al. |

(Continued)

FOREIGN PATENT DOCUMENTS

EP    0 854 024 A2    7/1998

(Continued)

OTHER PUBLICATIONS

Sweet, R.G., "High Frequency Recording with Electrostatically Deflected Ink Jets," The Review of Scientific Instruments, vol. 36, No. 2, Feb. 1965, pp. 131-136.

(Continued)

*Primary Examiner*—Joseph L Williams
(74) *Attorney, Agent, or Firm*—Husch Blackwell Sanders LLP

(57) ABSTRACT

The present invention relates to a method for manufacturing a light-emitting device. At least one of a light-emitting film forming step, a conductive film forming step and an insulating film forming step is carried out while holding a substrate in a manner that an angle subtended by a surface of the substrate and the direction of gravity is within a range of from 0 to 30°.

36 Claims, 20 Drawing Sheets

U.S. PATENT DOCUMENTS

| | | | |
|---|---|---|---|
| 5,344,676 | A | 9/1994 | Kim et al. |
| 5,399,502 | A | 3/1995 | Friend et al. |
| 5,583,552 | A | 12/1996 | Mutoh |
| 5,584,739 | A | 12/1996 | Itoh et al. |
| 5,678,116 | A | 10/1997 | Sugimoto et al. |
| 5,811,020 | A | 9/1998 | Alwan |
| 5,895,932 | A | 4/1999 | Bojarczuk, Jr. et al. |
| 5,898,185 | A | 4/1999 | Bojarczuk, Jr. et al. |
| 5,916,729 | A | 6/1999 | Kobayashi et al. |
| 5,952,037 | A | 9/1999 | Nagayama et al. |
| 6,023,073 | A | 2/2000 | Strite |
| 6,211,538 | B1 | 4/2001 | Park |
| 6,245,393 | B1 | 6/2001 | Thompson et al. |
| 6,252,246 | B1 | 6/2001 | Arai et al. |
| 6,280,273 | B1 | 8/2001 | Codama |
| 6,300,021 | B1 | 10/2001 | Gorog et al. |
| 6,319,321 | B1 | 11/2001 | Hiraga et al. |
| 6,348,359 | B1 | 2/2002 | Van Slyke et al. |
| 6,369,507 | B1 | 4/2002 | Arai |
| 6,403,392 | B1 | 6/2002 | Burrows et al. |
| 6,511,545 | B2 | 1/2003 | Banno et al. |
| 6,578,772 | B2 | 6/2003 | Fujimoto et al. |
| 6,696,105 | B2 | 2/2004 | Hiroki et al. |
| 6,776,880 | B1 | 8/2004 | Yamazaki |
| 6,784,118 | B2 | 8/2004 | Hayashi et al. |
| 6,821,553 | B2 | 11/2004 | Miyashita et al. |
| 6,843,937 | B1 | 1/2005 | Kiguchi et al. |
| 6,858,464 | B2 | 2/2005 | Yamazaki et al. |
| 6,864,638 | B2 | 3/2005 | Ishihara et al. |
| 7,141,817 | B2 | 11/2006 | Nishi et al. |
| 7,258,768 | B2 | 8/2007 | Yamazaki |
| 2001/0017409 | A1 | 8/2001 | Hiroki et al. |
| 2002/0031874 | A1 | 3/2002 | Yamazaki et al. |
| 2003/0122127 | A1 | 7/2003 | Yonekura et al. |
| 2005/0147739 | A1 | 7/2005 | Yamazaki et al. |
| 2007/0122937 | A1 | 5/2007 | Yamazaki et al. |

FOREIGN PATENT DOCUMENTS

| | | |
|---|---|---|
| EP | 0 880 303 A1 | 11/1998 |
| EP | 0 892 028 A2 | 1/1999 |
| EP | 1 071 117 A2 | 1/2001 |
| EP | 1 128 449 A2 | 8/2001 |
| EP | 0 854 024 B1 | 9/2002 |
| JP | 6-20936 | 1/1994 |
| JP | 6-182980 | 7/1994 |
| JP | 9-120985 | 5/1997 |
| JP | 10-12377 | 1/1998 |
| JP | 10-92576 | 4/1998 |
| JP | 10-113595 | 5/1998 |
| JP | 10-137665 | 5/1998 |
| JP | 10-153967 | 6/1998 |
| JP | 10-202153 | 8/1998 |
| JP | 11-40358 | 2/1999 |
| JP | 11-54270 | 2/1999 |
| JP | 11-54272 | 2/1999 |
| JP | 11-57587 | 3/1999 |
| JP | 2000-129442 | 5/2000 |
| JP | 2000-237672 | 9/2000 |
| JP | 2000-268967 | 9/2000 |
| JP | 2000-294375 | 10/2000 |
| JP | 2001-102170 | 4/2001 |
| JP | 2001-135704 | 5/2001 |
| JP | 2001-269608 | 10/2001 |
| JP | 2001-300394 | 10/2001 |
| JP | 2001-308082 | 11/2001 |
| JP | 2001-345176 | 12/2001 |
| JP | 2002-55220 | 2/2002 |
| WO | WO 90/13148 A1 | 11/1990 |

OTHER PUBLICATIONS

Pimbley, W.T. et al, "Satellite Droplet Formation in a Liquid Jet," IBM J. Res. Develop., vol. 21, No. 1, Jan. 1977, pp. 21-30.

Hertz, C.H. et al, "Ink Jet Printing of High Quality Color Images," Journal of Imaging Technology, vol. 15, No. 3, Jun. 1989, pp. 141-148.

Tsutsui, T. et al, "Electroluminescence in Organic Thin Films," Photochemical Processes in Organized Molecular Systems, 1991, pp. 437-450.

Baldo, M.A. et al, "Highly Efficient Phosphorescent Emission from Organic Electroluminescent Devices," Nature, vol. 395, Sep. 10, 1998, pp. 151-154.

Baldo, M.A. et al, "Very High-Efficiency Green Organic Light-Emitting Devices Based on Electrophosphorescence," Applied Physics Letters, vol. 75, No. 1, Jul. 5, 1999, pp. 4-6.

Schenk, H. et al, "Polymers for Light Emitting Diodes," Eurodisplay '99, Proceedings of the 19$^{th}$ International Display Research Conference, Berlin, Germany, Sep. 6-9, 1999, pp. 33-37.

Tsutsui, T. et al, "High Quantum Efficiency in Organic Light-Emitting Devices with Iridium-Complex as a Triplet Emissive Center," Japanese Journal of Applied Physics, vol. 38, part 2, No. 12B, Dec. 15, 1999, pp. L1502-L1504.

Kimura, M. et al, "Low-Temperature Poly-Si TFT Driven Light-Emitting Polymer Displays and Digital Gray Scale for Uniformity," IDW '99, 1999, pp. 171-174.

Hunter, I.M. et al, "Design of an Active Matrix Polymer-LED Display with Reduced Horizontal Cross-Talk," IDW '99, 1999, pp. 1095-1096.

Shimoda, T. et al, "Technology for Active Matrix Light Emitting Polymer Displays," IDEM 99, 1999, pp. 107-110.

Lee, J.D. et al, "Two-Dimensional Nozzle Arrangement in a Monolithic Inkjet Printhead for High-Resolution and High-Speed Printing," IDEM 99, 1999, pp. 127-130.

Shimoda, T. et al, "Technology for Active Matrix Light Emitting Polymer Displays, " IEDM 99, 1999, pp. 107-110.

Lee, J.D. et al, "Two-Dimensional Nozzle Arrangement in a Monolithic Inkjet Printhead for High-Resolution and High-Speed Printing," IEDM 99, 1999, pp. 127-130.

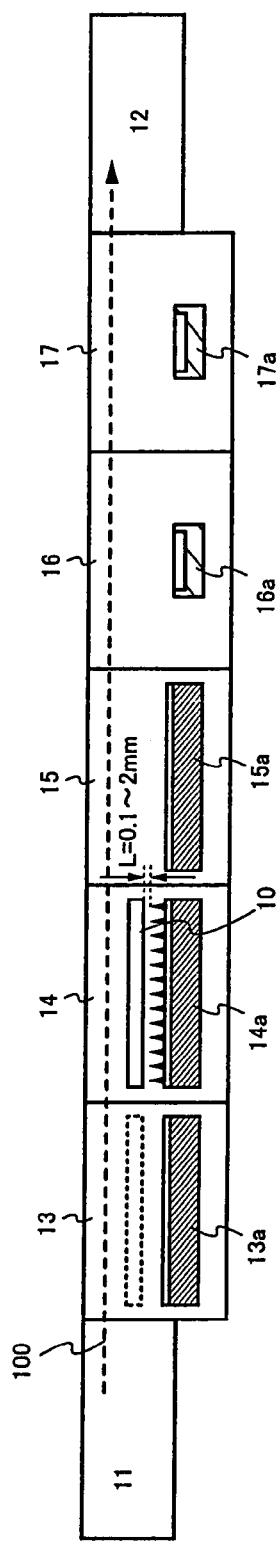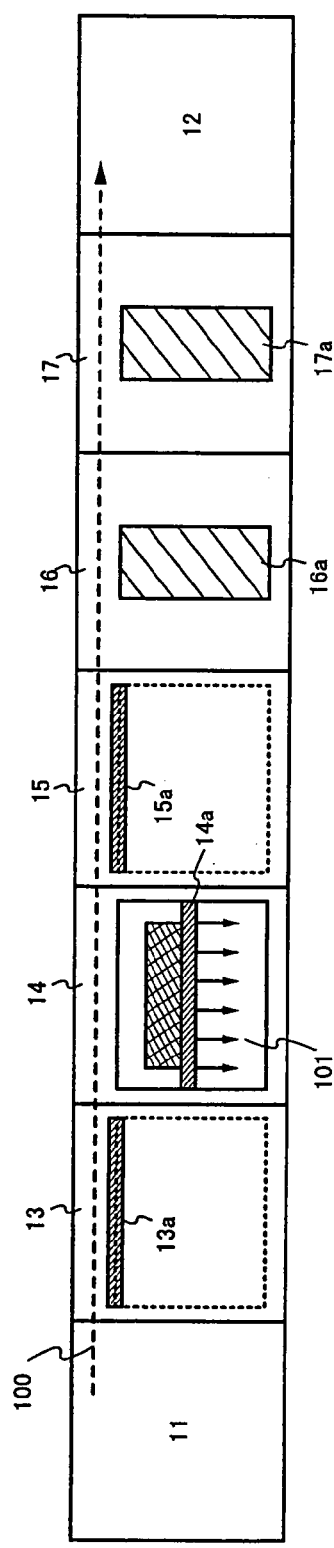

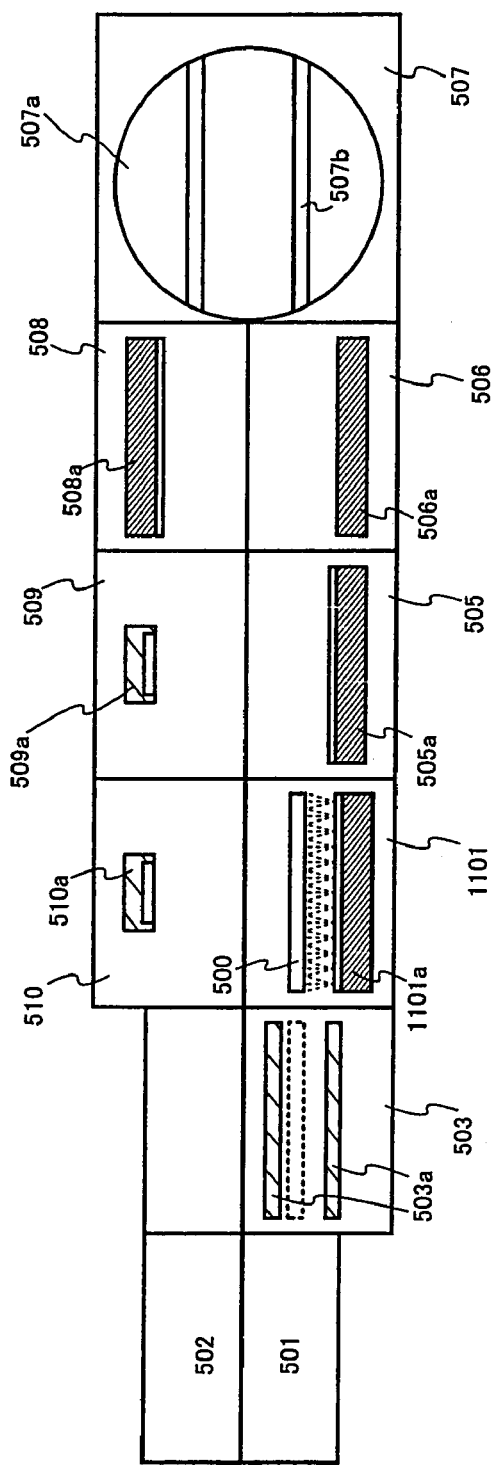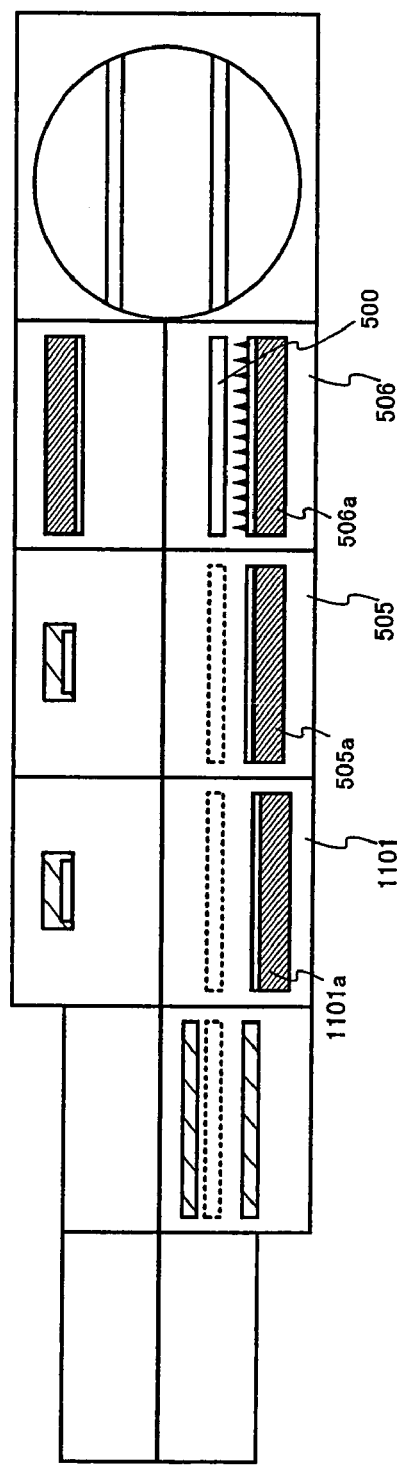
Fig. 11A
Fig. 11B

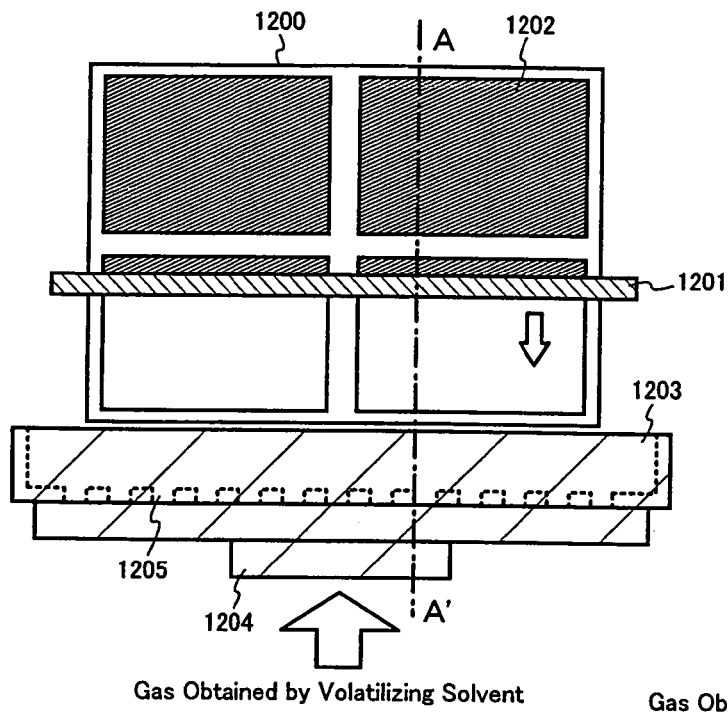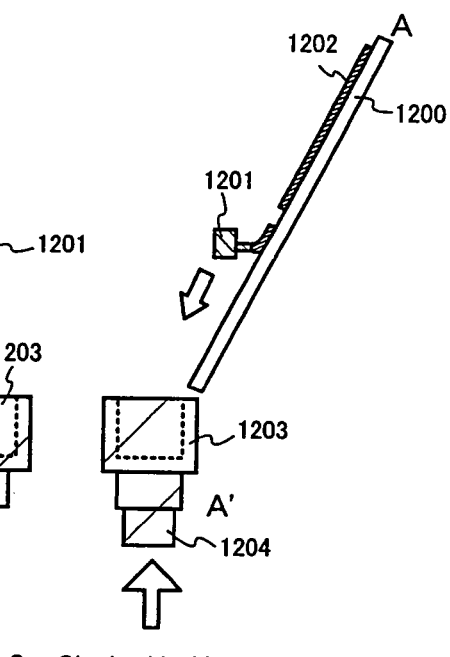
Gas Obtained by Volatilizing Solvent
Fig. 12A
Gas Obtained by Volatilizing Solvent
Fig. 12B
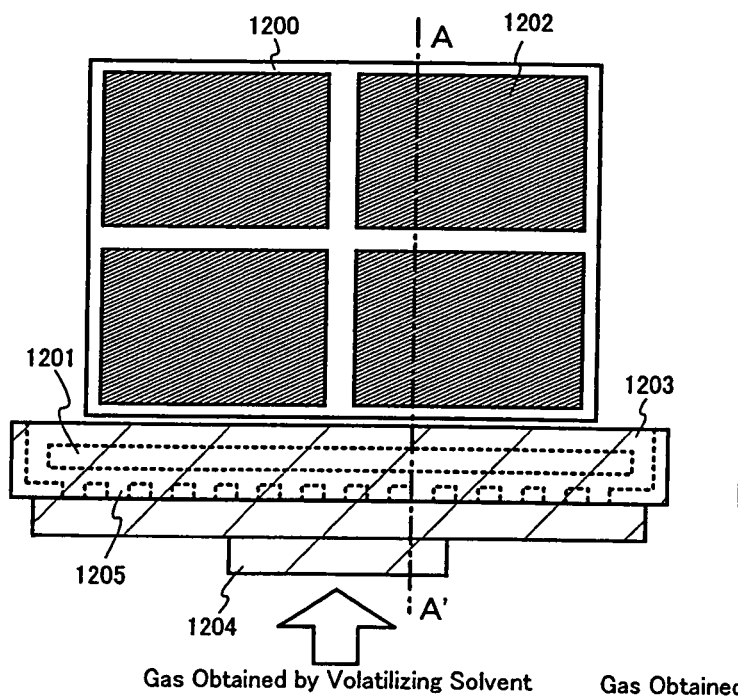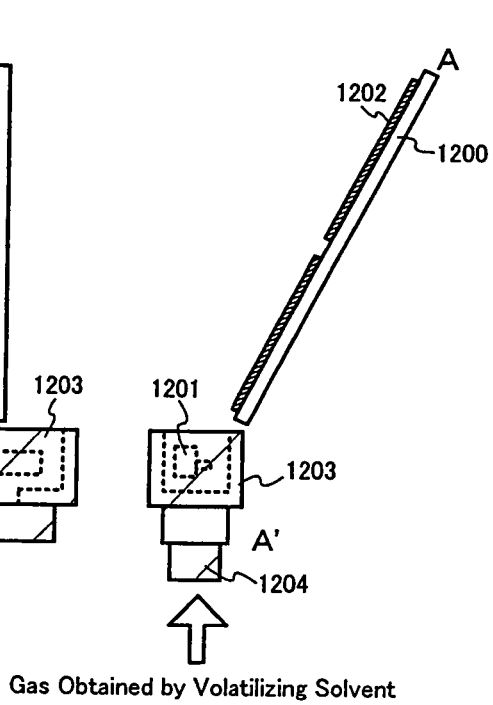
Gas Obtained by Volatilizing Solvent
Fig. 12C
Gas Obtained by Volatilizing Solvent
Fig. 12D

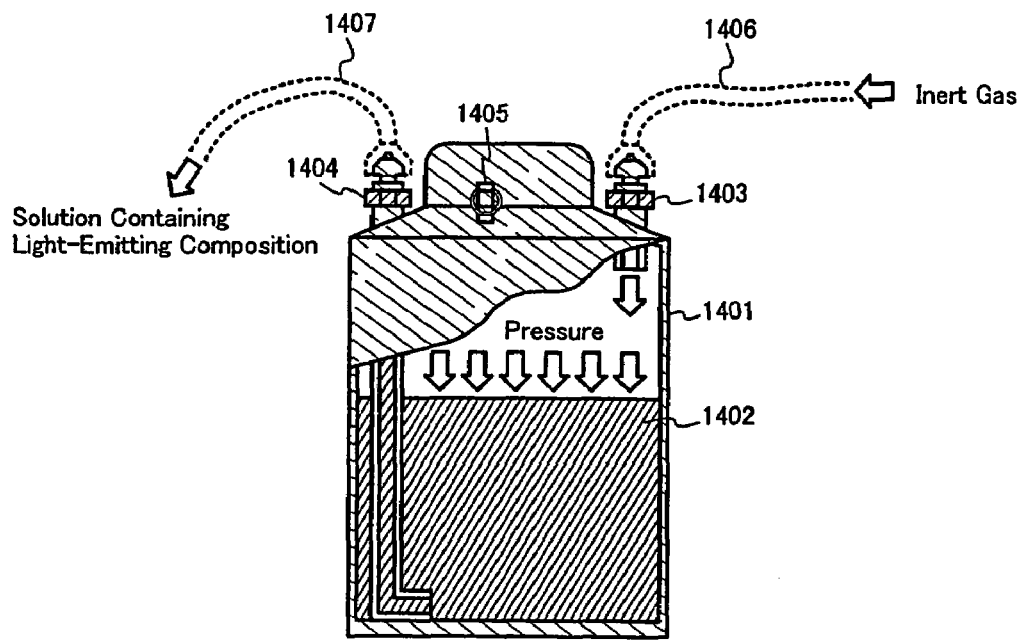
Fig. 14
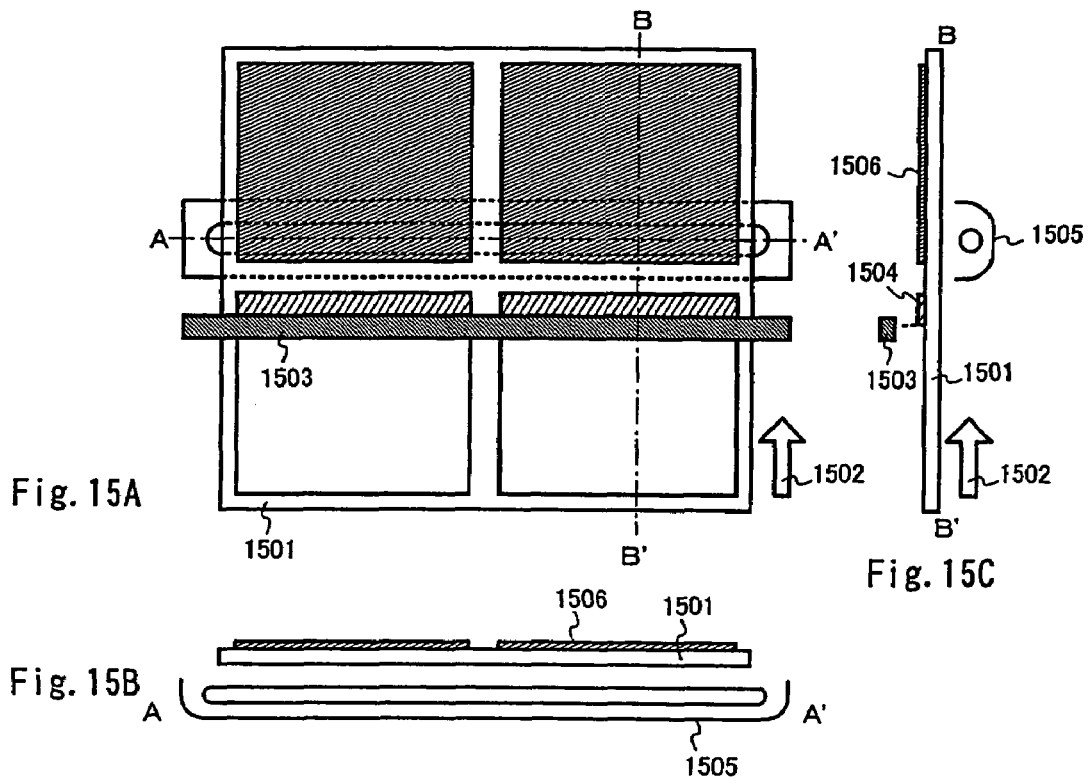
Fig. 15A
Fig. 15B
Fig. 15C

US 7,744,438 B2

PRODUCTION APPARATUS AND METHOD OF PRODUCING A LIGHT-EMITTING DEVICE BY USING THE SAME APPARATUS

This application is a divisional of U.S. application Ser. No. 10/614,565, filed on Jul. 7, 2003 (now U.S. Pat. No. 7,204,735 issued Apr. 17, 2007).

BACKGROUND OF THE INVENTION

1. Field of the Invention

This invention relates to a technical field covering display devices (hereinafter called light-emitting devices) comprising, on a substrate, an element (hereinafter called light-emitting element) having a structure comprising an anode, a cathode, and a thin film (hereinafter called light-emitting layer) sandwiched between the anode and the cathode to emit light relying upon a phenomenon called electroluminescence). The invention further relates to a technical field covering an apparatus for producing the above light-emitting device.

2. Description of the Related Art

In recent years, it has been urged to develop a light-emitting device called organic EL panel and organic light-emitting diode (OLED) as video displays. This is realized by generating a light-emitting phenomenon called electroluminescence by recombining positive holes and electrons in the light-emitting layer formed between an electrode (hereinafter called anode) for injecting positive holes and an electrode (hereinafter called cathode) for injecting electrons, and by controlling on/off of light emission to display images.

The light-emitting element which plays the most important role in the light-emitting devices includes the light-emitting layer (particularly, the light-emitting layer comprising an organic compound) which is very weak against oxygen and moisture, is easily degraded and, must, hence, be fabricated with utmost care. Namely, technology is required for carrying out a series of processes from the formation of an anode (or a cathode), formation of a light-emitting layer, up to the formation of the cathode (or the anode) followed by sealing (for intimately sealing the light-emitting element) keeping off the atmosphere. Therefore, the apparatus for producing the light-emitting devices tends to become bulky requiring an increased floor area (so-called footprint).

The production apparatus having a large foot print is accompanied by a difficulty in laying out the clean room and, further, becomes considerably heavy. Therefore, a very high cost is required for designing the clean room. At present, however, the film-forming device and the sealing device have simply been coupled together in the form of a multi-chamber still leaving much room for development from the standpoint of decreasing the size and reducing the weight as a production apparatus.

At present further, a method has been vigorously developed for forming the light-emitting layer used for the light-emitting device by applying a solution, such as by a spin-coating method, an ink jet method or a printing method. In particular, formation of a thin organic film by the ink jet method is already approaching a practicable level, and its basic technology has been disclosed in, for example, JP-A-10-12377.

The ink jet method is technology accomplished by applying the ink jet system that has heretofore been used in the printers to the formation of thin films, by using, instead of an ink, a solvent such as water or an alcohol in which is dissolved or dispersed a solute that is a material of the organic thin film, and applying a droplet solution to each of the pixels. When the ink jet method is used, the size of the apparatus can be decreased since no vacuum device is required. When constructed in the form of a multi-chamber, however, the apparatus as a whole becomes inevitably bulky.

SUMMARY OF THE INVENTION

This invention was accomplished in view of the above problems, and provides an apparatus of a small footprint for producing light-emitting devices and a method of producing light-emitting devices by using the above production apparatus.

Namely, the invention provides an apparatus for producing light-emitting devices, comprising a loading chamber, a chamber for forming a film of a light-emitting material, a chamber for forming a film of an electrically conducting material, a chamber for forming a film of an insulating material and an unloading chamber; wherein the chamber for forming the film of the light-emitting material is the one for forming the film of the light-emitting material by a method of injecting a solution containing a light-emitting composition as droplets (dots) or as a continuous fluid (hereinafter referred to as liquid jet method);

the chamber for forming the film of the electrically conducting material is the one for forming the film of the electrically conducting material by a sputtering method; and the chamber for forming the film of the insulating material is the one for forming the film of the insulating material by the sputtering method;

and wherein a substrate to be treated is so supported that an angle subtended by the film-forming surface of the substrate to be treated and the direction of gravity is within from 0 to 30° in all of the loading chamber, the chamber for forming the film of the light-emitting material, the chamber for forming the film of the electrically conducting material, the chamber for forming the film of the insulating material and the unloading chamber. Here, the loading chamber and the unloading chamber can be used in common. Namely, there arouses no particular problem even when the two chambers are formed integrally together.

The most important feature of the invention is that in carrying out a series of treatments from the formation of the light-emitting material through up to the sealing keeping off the atmosphere, the substrate to be treated is supported in an erected state all the time of film formation and transportation, i.e., the substrate to be treated is so supported that an angle subtended by the film-forming surface of the substrate to be treated and the direction of gravity is within from 0 to 30° (preferably, from 0 to 10°). With the substrate to be treated being erected, the floor areas (footprint) occupied by the conveyer mechanism and by the film-forming chambers can be decreased, and the footprint of the production apparatus as a whole can be decreased. The substrate may be so arranged that the long side is in the up-and-down direction or the short side is in the up-and-down direction. In order to more positively decrease the footprint of the production apparatus, however, it is desired that the short side is in the up-and-down direction.

In this invention, the light-emitting material stands for a carrier injection layer (a positive hole injection layer or an electron injection layer), a carrier-transporting layer (a positive hole-transporting layer or an electron-transporting layer), a carrier-blocking layer (a positive hole-blocking layer or an electron-blocking layer), a light-emitting layer or an organic compound or an inorganic compound that contributes to recombining carriers, or a laminate thereof. The light-emitting composition stands for the one that becomes a light-emitting material, and may be an organic compound or an inorganic compound. The light-emitting composition roughly includes a light-emitting material or a carrier (positive hole or electron)-transporting material.

The light-emitting material is the one that creates a light-emitting phenomenon by electroluminescence upon injecting positive holes and electrons. The light-emitting material may be either the inorganic compound or the organic compound. In the method of applying the solution such as the one of this invention, it is desired to use the organic compound. As the light-emitting material, further, there can be used a material which emits fluorescence by singlet excitation or a material which emits phosphorescence by triplet excitation. The positive hole-transporting material is the one in which positive holes easily migrate, and the electron-transporting material is the one in which electrons easily migrate.

The production apparatus of the invention may form the film of the light-emitting material relying not only upon the liquid jet method but also upon the printing method, spray method or any other method of applying a solution. The printing method is the one for forming a film of the light-emitting material by applying a solution containing a light-emitting composition relying upon such a printing method as screen-printing method or relief printing method followed by firing. Further, the spray method is the one for forming a film of the light-emitting material by applying a solution containing the light-emitting composition in the form of a mist followed by firing. These three methods are the ones for forming a film of the light-emitting material by applying the solution containing the light-emitting composition, followed by firing, and can, generally, be called solution application methods.

The solution application methods may be carried out under the atmospheric pressure or in a pressurized atmosphere. The light-emitting composition is easily deteriorated by the presence of oxygen or moisture. It is therefore desired that the atmosphere does not contain moisture as much as possible. It is further desired to use nitrogen, rare gas or any other inert atmosphere. The atmosphere may further contain a solvent component of a solution that is to be applied. When the atmosphere contains the solvent component, the solution does not dry at the injection port even in case the step of application is discontinued, and a probability of causing restriction decreases.

Upon selecting the solvent, further, it is allowable to apply the solvent under a reduced pressure condition. The reduced pressure condition stands for the one in which the pressure is lower than the atmospheric pressure. In an atmosphere filled with nitrogen, a rare gas or any other inert gas, the pressure may be from $1\times10^2$ to $2\times10^4$ Pa (desirably, from $5\times10^2$ to $5\times10^3$ Pa), or may be more highly evacuated to be 1 to $5\times10^4$ Pa ($1\times10^2$ to $1\times10^3$ Pa). Upon decreasing the pressure, the solvent volatilizes at all times from the liquid droplets injected into the atmosphere before the droplets arrive at the pixel electrodes, and the volume of the droplets decreases. Accordingly, the step of firing can be conducted within short periods of time.

When formed by the solution application method, the light-emitting material chiefly comprises an organic compound; i.e., it is desired to use a high-molecular organic compound. The high-molecular organic compound exhibits excellent heat resistance and is little deteriorated from the standpoint of the material. It can therefore be said that the high-molecular organic compound is a material that is suited for the fabrication of highly reliable light-emitting devices.

Further, the production apparatus of the invention has a feature of employing the sputtering method for the formation of films of the electrically conducting material and of the insulating material from the standpoint of preventing such elements as the light-emitting materials and transistors from being deteriorated by the irradiation with electron rays, X-rays or any other radiant rays. The vacuum evaporation has heretofore been used for forming a film of the electrically conducting material (particularly, a cathode material) causing, however, the light-emitting material and the transistors to be deteriorated by radiant rays generated at the time of vacuum evaporation. In order to solve this problem, the production apparatus of this invention employs the sputtering method which will not generate radiant rays. This constitution is effective particularly in the production of active matrix-type light-emitting devices.

As the electrically conducting material, there is formed a metal film that serves as a cathode or an electrically conducting oxide film that serves as an anode. As the metal film that serves as the cathode, there can be used a metal film containing an element pertaining to Group 1 or 2 of periodic table. An aluminum film containing lithium is particularly preferably used. As the electrically conducting oxide film that serves as an anode, further, there can be used an indium oxide, a tin oxide, a zinc oxide, or a compound thereof.

As the insulating material, further, it is desired to use a film which permits oxygen or moisture to pass through little, such as a nitrogen-containing silicon compound as represented by a silicon nitride film or a silicon oxynitride film. There can be further used an aluminum nitride film or a diamond-like carbon (DLC) film. In particular, the silicon nitride is easily formed by the sputtering method and is desired making it possible to form a dense film.

The production apparatus described above carries out the processing from the formation of the light-emitting material through up to the sealing for protecting the light-emitting material from oxygen keeping out the atmosphere, making it possible to produce highly reliable light-emitting devices. Besides, the whole processing is conducted in a state where the substrates are erected, making it possible to decrease the footprint of the production apparatus and to greatly increase the degree of freedom in the step of designing, such as laying out the clean room. By using the simple solution application method for forming the light-emitting material, further, the cost of producing the light-emitting device is decreased. Further, use of a high-molecular organic compound as the light-emitting layer improves the reliability of the light-emitting devices.

BRIEF DESCRIPTION OF THE DRAWINGS

FIGS. 1A and 1B are a top view and a side view of a production apparatus according to the invention;

FIGS. 11A and 11B are top views illustrating the production apparatus according to the invention;

FIGS. 12A to 12D are views illustrating a film formed by the line jet method;

FIG. 14 is a sectional view of a container for containing a solution containing a light-emitting composition;

FIGS. 15A, 15B and 15C are views illustrating an example of fabricating a light-emitting device by a solution application method;

DESCRIPTION OF THE PREFERRED EMBODIMENTS

Embodiment 1

Figure 2A:
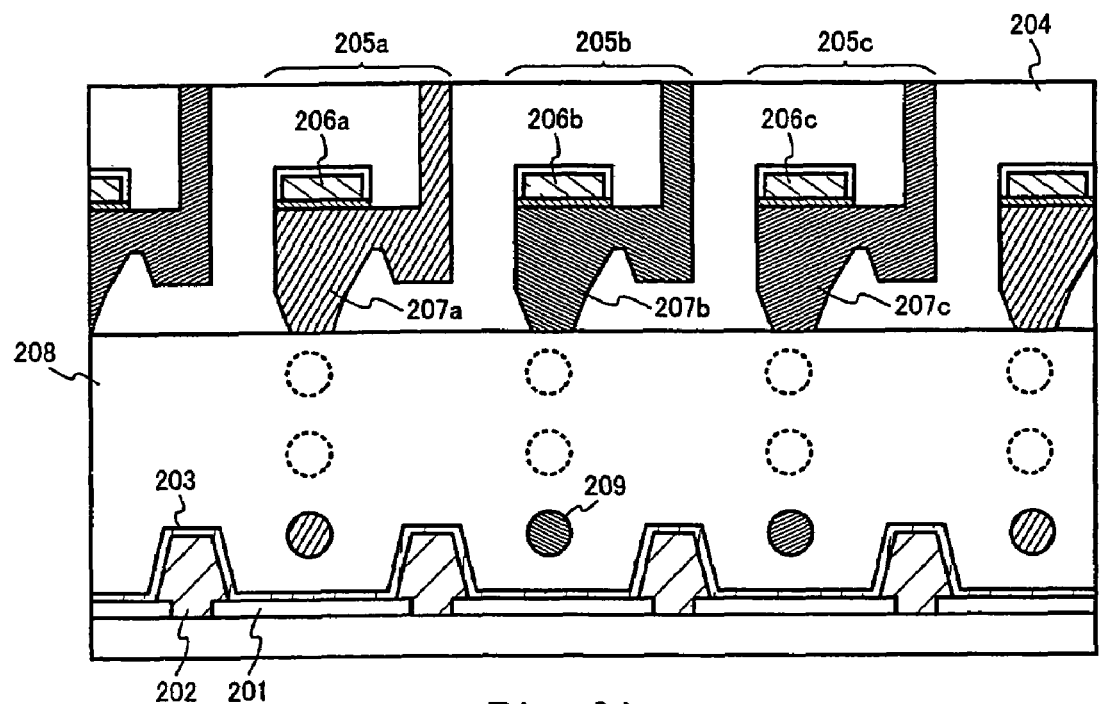
FIGS. 2A and 2B are views illustrating a principle of a dot jet method.

This embodiment deals with a production apparatus of the in-line type for carrying out the steps of from the formation of the light-emitting material through up to the formation of the cathode with reference to FIG. 1A which is a top view and FIG. 1B which is a side view. The chambers drawn here are not of the same scale. When the production apparatus is to be really constructed, therefore, the volumes must be suitably determined by making reference to the functions of the chambers that will now be described in this embodiment.

In FIGS. 1A and 1B, reference 11 denotes a loading chamber for conveying the substrate in, 12 denotes an unloading chamber for conveying the substrate out, 13 denotes a film-forming chamber for forming a positive hole injection layer, 14 denotes a film-forming chamber for forming a light-emitting layer, 15 denotes a film-forming chamber for forming an electron injection layer, 16 denotes a film-forming chamber for forming a metal film that serves as a cathode, and 17 denotes a film-forming chamber for forming a protection film having a passivation effect. In the drawings, an arrow 100 indicates a direction in which the substrates 10 are conveyed. The substrate that has been treated already is represented by a dotted line. Here, the substrate 10 is conveyed in an erected state, i.e., in a state in which an angle subtended by the film-forming surface (surface to be treated) and the direction of gravity is within from 0 to 30°.

The film-forming chambers 13 to 15 are for forming light-emitting materials, In this embodiment, the film-forming chambers are furnished with a liquid jet method (in particular, a system for injecting a solution in the form of droplets is called dot jet method, which is also called ink jet method). The features of the film-forming chamber employing the dot jet method will now be described with reference to FIGS. 2A and 2B.

FIG. 2A is a view illustrating, on an enlarged scale, a portion (hereinafter called head portion) that works as a head for effecting the dot jet in a device for applying a solution based on the dot jet method and the peripheries thereof. Concretely speaking, FIG. 2A illustrates a state right after a solution containing the light-emitting material is injected from the head portion. In this embodiment, the light-emitting materials corresponding to three colors of red, green and blue are separately applied in one film-forming chamber.

In FIG. 2A, reference numeral 201 denotes a pixel electrode which works as an anode or a cathode of a light-emitting element. Reference numeral 202 denotes an insulator for sectionalizing the pixels, and 203 denotes a carrier injection layer. The carrier injection layer 203 is a positive hole injection layer when the pixel electrode 201 is an anode and is an electron injection layer when the pixel electrode 201 is a cathode. The head portion 204 includes a plurality of injection portions 205a to 205c having a function for injecting solutions containing the light-emitting materials and being provided with piezoelectric elements 206a to 206c. The injection portions 205a to 205c are filled with solutions 207a to 207c containing the light-emitting materials.

Here, the solution 207a contains a light-emitting material that emits red light, the solution 207b contains a light-emitting material that emits green light and the solution 207c contains a light-emitting material that emits blue light. These three kinds of light-emitting materials constitute a pixel for emitting red light, a pixel for emitting green light and a pixel for emitting blue light. These three pixels are regarded to constitute a pixel unit.

Though FIG. 2A illustrates only those injection portions corresponding to R (red), G (green) and B (blue), it is allowable to arrange a plurality of injection portions (nozzles) in parallel. By taking the throughput into consideration, it is most desired to arrange the injection portions in a number corresponding to the number of pixels of one row or column of pixels. In this embodiment, the light-emitting layer is formed on all of the pixels through one time of scanning by using a head portion (i.e., a linear or rectangular head portion) equipped with injection portions corresponding to a row of pixels. It is allowable to effect the application in an overlapped manner by performing the scanning a plurality of number of times.

Further, a space 208 between the head portion 204 and the pixel electrode 201 is filled with nitrogen under the atmospheric pressure. It is particularly desired that the contents of oxygen and moisture are maintained to be very small at the time of purification. There may be further contained the solvent component (same as the solvent of a solution containing the light-emitting material) in addition to nitrogen or instead of nitrogen. This prevents the ends of the injection portions 205a to 205c from being dried, and prevents restriction.

The solutions 207a to 207c containing the light-emitting materials filled in the injection portions 205a to 205c are pressurized and pushed out due to changes in the volumes of the piezoelectric elements 206a to 206c, and are injected toward the pixel electrode 201. As a result, the light-emitting materials are intermittently deposited. The injected liquid droplets 209 are deposited on the pixel electrodes 201 and are fired to form light-emitting layers. The firing is conducted by being exposed in vacuum, by heating or by a combination thereof.

The production apparatus of this embodiment forms the light-emitting materials based on the liquid jet method that has features as described above. Namely, in FIGS. 1A and 1B, head portions 13a to 15a are provided in the film-forming chambers 13 to 15. All of these head portions have a constitution as described with reference to FIGS. 2A and 2B, and apply the solutions containing organic compounds or inorganic compounds. There may be provided a mechanism for heating the substrates 10 at room temperature (typically, 20°

C.) to 300° C., and, more preferably, at 50 to 200° C. Provision of the heating mechanism makes it possible to effect the heating simultaneously with the application of solutions, eliminating the need of separately providing a step of firing.

In FIG. 1B, further, the side view of the film-forming chamber (light-emitting layer) 14 corresponds to when the head portion that moves along the surface of the substrate (film-forming surface) is viewed from the upper side. Arrows 101 indicate the direction in which the head portion 14a moves, from one end of the substrate 10 to the other end thereof in parallel with the surface of the substrate to apply the solution thereto. Referring to FIG. 1A, it is desired that the distance L between the substrate 10 and the front end (injection port) of the head portion 14a is from 0.1 to 2 mm.

Here, the nitrogen gas, a rare gas or any other inert gas is flowing through the film-forming chambers 13 to 15 from the upper side down to the lower side in a direction perpendicular to the surface of the paper, and a laminar flow of the inert gas is formed between the substrates 10 and the head portions 13a to 15a. Here, the inert gas that is flowing may be heated instead of heating the substrates or while heating the substrates.

Figure 3:
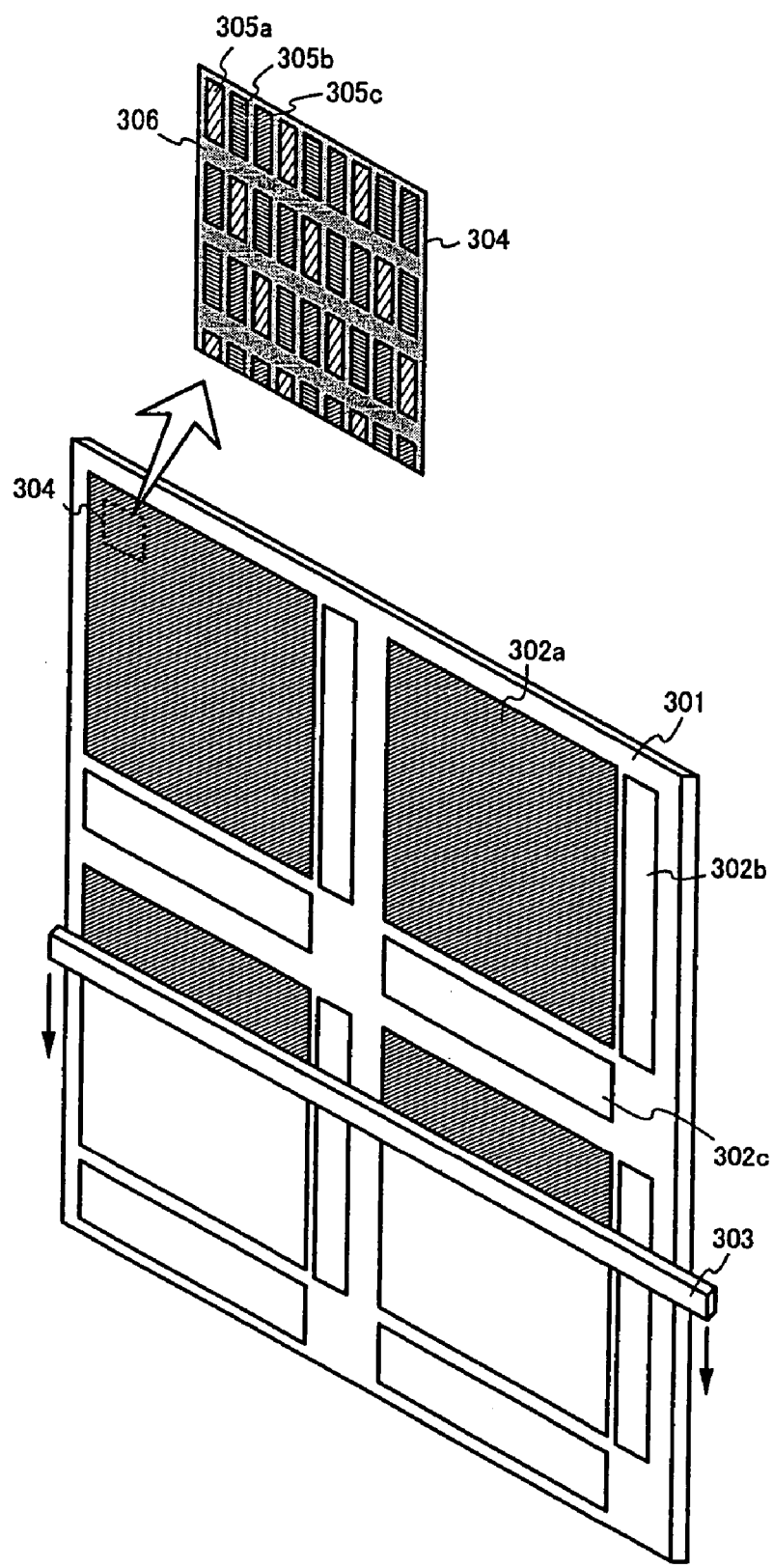
FIG. 3 is a view illustrating a film formed by the dot jet method.
Figure 4:
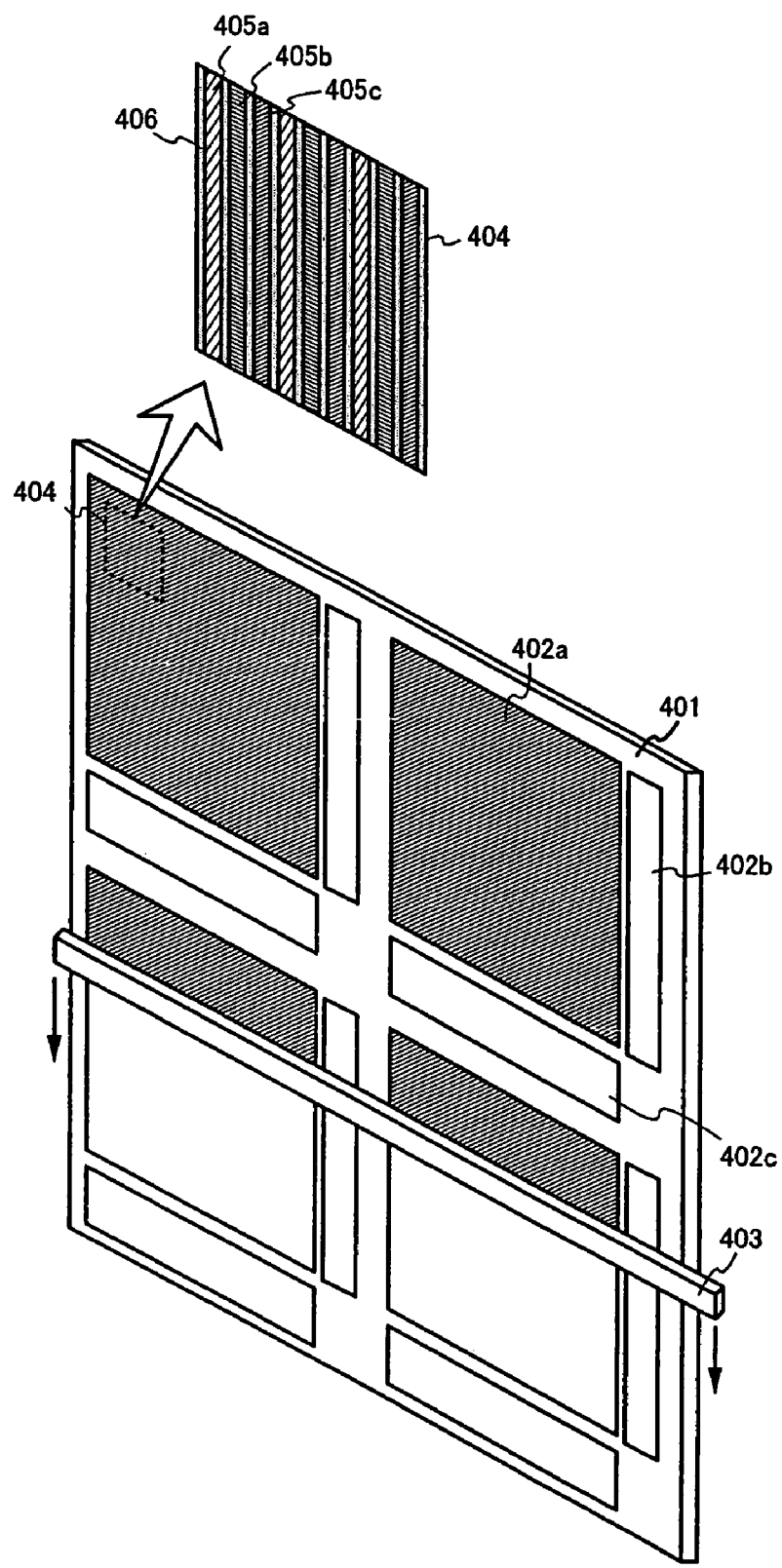
FIG. 4 is a view illustrating a film formed by the dot jet method.

Described below with reference to FIGS. 3 and 4 is how to apply the solutions containing the light-emitting materials by using the production apparatus of this embodiment. In FIG. 3, reference numeral 301 is an active matrix substrate of which thin-film transistors and pixel electrodes are formed. Circuits corresponding to four panels are formed on a piece of glass substrate. Each panel is constituted by a pixel portion 302a, a gate line drive circuit 302b and a data line drive circuit 302c, to which only, however, the invention is in no way limited.

The head portion 303 scans the active matrix substrate 301 from the upper side to the lower side (direction of arrows) along the film surface, and the light-emitting materials are successively injected onto the pixels as illustrated in a portion 304 shown on an enlarged scale as surrounded by a dotted line. Reference numeral 305a denotes pixels to which is applied the light-emitting material corresponding to red color, 305b denotes pixels to which is applied the light-emitting material corresponding to green color, and 305c denotes pixels to which is applied the light-emitting material corresponding to blue color. Further, reference numeral 306 denotes an insulating film for sectionalizing the pixels.

In FIG. 3, the light-emitting materials are applied in a unit of a pixel. As shown in FIG. 4, however, the light-emitting materials may be applied in a unit of a column of pixels. In FIG. 4, reference numeral 401 is an active matrix substrate on which thin-film transistors and pixel electrodes are formed. A pixel portion 402a, a gate line drive circuit 402b and a data line drive circuit 402c are formed thereon. The head portion 403 scans the active matrix substrate 401 from the upper side to the lower side (direction of arrows) along the film surface, and the light-emitting materials are continuously injected onto the column of pixels as illustrated in a portion 404 shown on an enlarged scale as surrounded by a dotted line. Reference numeral 405a denotes a column of pixels to which is applied the light-emitting material corresponding to red color, 405b denotes a column of pixels to which is applied the light-emitting material corresponding to green color, and 405c denotes a column of pixels to which is applied the light-emitting material corresponding to blue color. Further, reference numeral 406 denotes an insulating film for sectionalizing the column of pixels.

The solutions applied in the film-forming chambers 13 to 15 form thin films through the step of firing such as Treating in vacuum. Though not illustrated in this embodiment, the treatment may be conducted at one time after the solutions have been applied to all of the pixels, or the solutions may be applied and the firing step may be conducted separately from each other for the pixels corresponding to the red, green and blue colors.

In FIGS. 3 and 4, the head portion has scanned from the upper end down to the lower end of the substrate. It is, however, also allowable that the head portion scans from the left end toward the right end. In this case, there may be employed a system which moves the substrate.

The substrate 10 on which the light-emitting materials have been formed in the film-forming chambers 13 to 15 constituted as described above, is, then, conveyed into the film-forming chamber 16. The film-forming chamber 16 is for forming a metal film that serves as a cathode by the sputtering method, and the film is formed while the substrate 10 passes by the side of a rectangular target 16a. It is made possible to form a metal film containing an element belonging to the Group 1 or 2 of periodic table, such as an alloy film of, for example, aluminum and lithium. Though there is no limitation on the shape of the target 16a, the substrate 10 that is vertically arranged offers an advantage in that it is allowed to use a target of a slender shape such as a linear shape, a rectangular shape, an elliptic shape or any other like shape to decrease the areas occupied by the apparatus yet maintaining a high throughput.

The film-forming chamber 17 is for forming an insulating film having a passivation effect by the sputtering method (preferably, by the high-frequency sputtering method). In this film-forming chamber 17 like in the above film-forming chamber 16, the film is formed while the substrate 10 passes by the side of a rectangular target 17a. It is made possible to form a highly dense silicon compound film, such as a silicon nitride film or a silicon oxynitride film.

The substrate 10 which was finished up to the sealing step is conveyed to the unloading chamber 12 and is taken out. Here, the loading chamber 11 and the unloading chambers 12 are described as separate chambers. However, the loading chamber and the unloading chambers may be formed integrally together to share the function.

Embodiment 2

In the embodiment 1, the light-emitting materials corresponding to red, green and blue were separately applied in the film-forming chamber 14. In this embodiment, however, the light-emitting materials corresponding to red, green and blue are applied in separate film-forming chambers to form films. The chambers drawn here are not of the same scale. When the production apparatus is to be really constructed, therefore, the volumes must be suitably determined by making reference to the functions of the chambers that will now be described in this embodiment.

Figure 5:
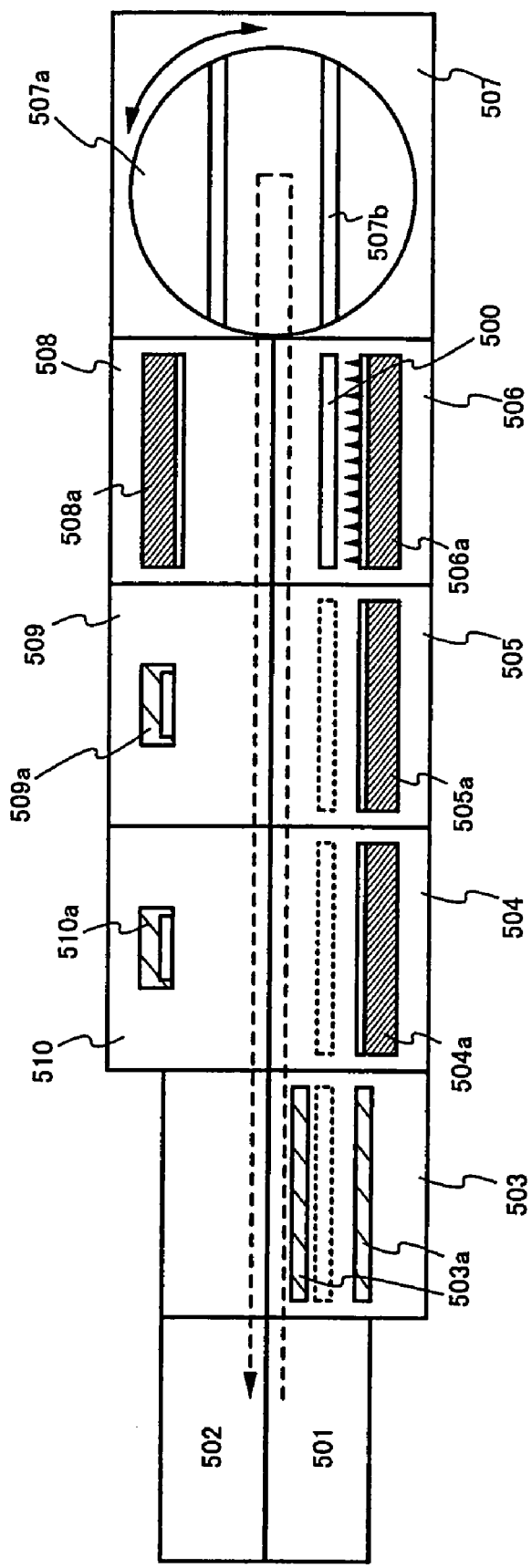
FIG. 5 is a top view of the production apparatus according to the invention.

The production apparatus shown in FIG. 5 has a basic constitution which is of the same in-line type as the one illustrated in FIG. 1, but is different with respect to providing a plasma treatment chamber, dividing each film-forming chamber into three chambers, and providing a turn chamber for coupling the film-forming chambers by turning. A substrate 500 conveyed through a loading chamber 501 is, first, conveyed into a plasma treatment clamber 503 where the surfaces of pixel electrodes formed on the substrate 500 are treated with a plasma so as to be cleaned and to adjust the work function. When the pixel electrode is an anode, an oxygen plasma or an ozone plasma is preferred. The plasma may be generated by establishing an electric field across the electrodes 503a.

Then, in a film-forming chamber 504, a head portion 504a applies a solution containing an organic compound. After the application, a firing step is conducted by heating to thereby form a positive hole injection layer. The firing step by heating can be conducted simultaneously with the application of the solution in a state where the substrate is heated. The method of applying the solution by using the head portion was described already in the embodiment 1, and is not described here.

Next, a light-emitting layer R (corresponding to red color) and a light-emitting layer G (corresponding to green color) are formed in film-forming chambers 505 and 506. The light-emitting layers are formed through the step of applying the solutions containing the light-emitting materials by using head portions 504a and 505a provided in the chambers and through the firing step by heating. The substrate 500 is conveyed while the light-emitting layers corresponding to pre-determined colors are being formed thereon through the chambers. In forming the light-emitting layers, the firing step is conducted simultaneously with the application of solutions.

The substrate 500 on which the light-emitting layer R and the light-emitting layer G have been formed is conveyed into a turn chamber 507. A turntable 507a is installed in the turn chamber 507, and two rails 507b are provided thereon. The turn table 507a turns by 180° in a state where the substrate 500 is placed on either one of the rails 507b, and the substrate 500 moves onto a line in a next film-forming chamber 508.

Then, a light-emitting layer B (corresponds to blue color) is formed in the film-forming chamber 508. The light-emitting layer B is formed through the step of applying a solution containing a light-emitting material by using a head portion 508a and through the firing step by heating conducted simultaneously therewith.

Next, the substrate 500 is conveyed into a film-forming chamber 509 where a metal film that serves as a cathode is formed by the sputtering method. The film is formed while the substrate 500 passes by a rectangular target 509a like in the embodiment 1. The shape of the target 509a is not limited thereto only, and it is allowed to use a target of a linear shape, a rectangular shape, an elliptic shape or any other slender shape like in the embodiment 1.

In a film-forming chamber 510 for forming an insulating film that serves as a protection film, an insulating film is formed on the cathode by the sputtering method (preferably, by the high-frequency sputtering method) thereby to seal the light-emitting materials formed on the substrate 500. A silicon nitride film is preferred as the insulating film The substrate 500 which was finished up to the sealing step is conveyed into an unloading chamber 502 and is taken out. The light-emitting materials are formed, the cathodes are formed and the protection film is formed (sealed) through the above series of steps keeping off the atmosphere. Here, the loading chamber 501 and the unloading chambers 502 are described as separate chambers. However, the loading chamber and the unloading chambers may be formed integrally together to share the function.

Embodiment 3

In this embodiment as will be described below with reference to FIGS. 6A and 6B, the constitution of the head portion is different from that of the embodiments 1 and 2 shown in FIGS. 2A and 2B. Namely, the solution is applied not by injecting the liquid droplets but by applying a gel-like solution having a certain degree of viscosity. This method is called line jet method since it injects the solution as a line of a continuous fluid.

Figure 6A:
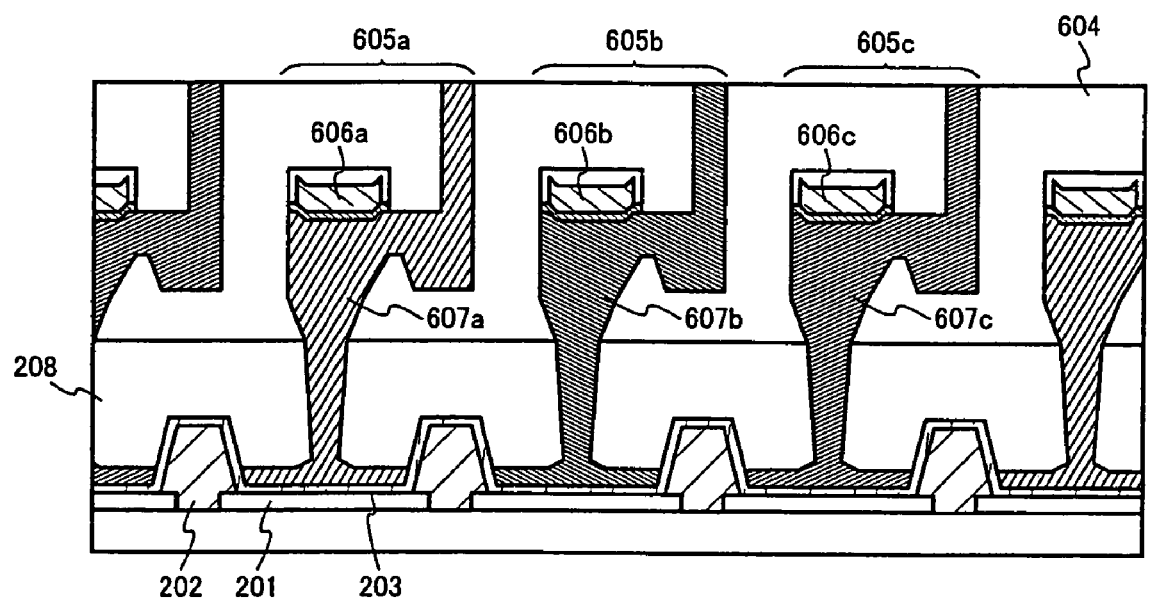
FIGS. 6A and 6B are views illustrating a principle of a line jet method.
Figure 6B:
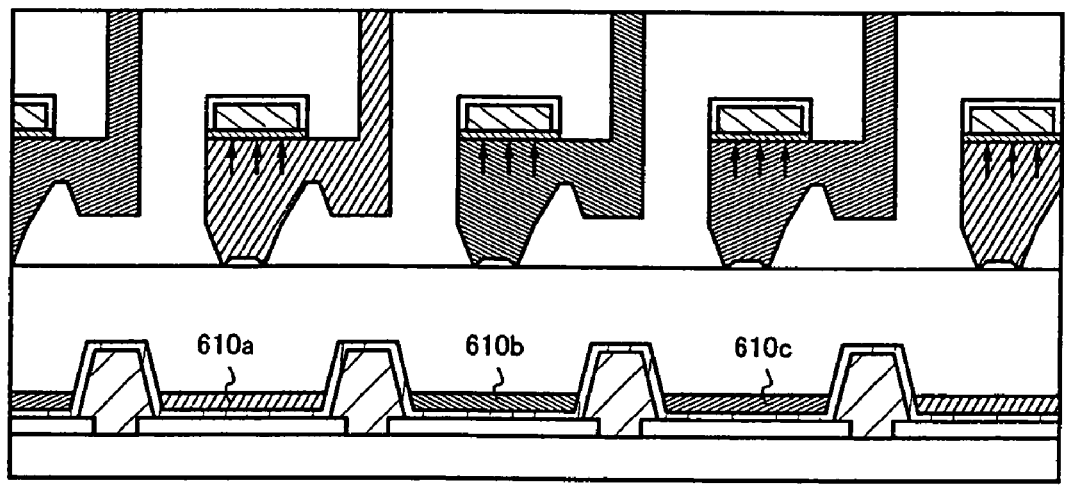

FIG. 6A illustrates a state where the solutions containing the light-emitting materials are injected, and FIG. 6B illustrates a state where the solutions containing the light-emitting materials have not been injected. As for the same reference numerals as those used in FIGS. 2A and 2B, reference should be made to the description of the embodiment 1.

In this embodiment as shown in FIG. 6A, a head portion 604 has a plurality of injection portions 605a to 605c having a function for injecting the light-emitting materials and having piezoelectric elements (piezo-resistance elements) 606a to 606c. The injection portions 605a to 605c are filled with solutions 607a to 607c containing the light-emitting materials. Here, in the same manner as in FIG. 2A, the solution 607a contains the light-emitting material which emits red light, the solution 607b contains the light-emitting material which emits green light, and the solution 607c contains the light-emitting material which emits blue light.

In this embodiment, however, the solutions 607a to 607c containing the light-emitting materials have a viscosity larger than the viscosity of the solutions 207a to 207c containing the light-emitting materials of the embodiment 1. This is to continuously apply the solutions containing the light-emitting materials and, as a result, the light-emitting materials are continuously deposited. As shown in FIGS. 6A, further, when the solutions 607a to 607c containing the light-emitting materials are to be applied, the solutions 607a to 607c containing the light-emitting materials are pressurized and pushed out by using an inert gas such as nitrogen in a state where the piezoelectric elements 606a to 606c are maintained pushed down.

At this moment, it is desired that the distance is as short as possible between the injection portions 605a to 605c and the pixel electrodes 201. For instance, the distance is desirably from about 0.1 to about 0.5 mm. In the case of this embodiment, the solutions must be applied by being injected vertically to the substrate. It is, however, difficult to vigorously inject the solutions 607a to 607c containing the light-emitting materials because of their large viscosity. Accordingly, the solutions can be correctly applied onto the pixel electrodes 201 when the distance is short as much as possible.

When the application of the solutions 607a to 607c containing the light-emitting materials is discontinued as shown in FIG. 6B, no pressure is applied by the inert gas, and the piezoelectric elements 606a to 606c are maintained pushed up (in the direction of arrows). Then, the solutions containing the light-emitting materials move slightly back away from the injection ports and are prevented from drying. Here, a space 608 may be an atmosphere containing the solvent component to prevent the solutions 607a to 607c containing the light-emitting materials from drying at the injection ports.

The solutions that are applied may be fired by heating or may be fired being exposed to vacuum. Or, these firing methods may be used in combination. Thus, there are formed the light-emitting layer 610a emitting red light, light-emitting layer 610b emitting green light and light-emitting layer 610c emitting blue light as shown in FIG. 6B. Then, as required, a carrier transporting layer and a carrier injection layer are formed, followed by the formation of opposing electrodes (cathode for the anode and anode for the cathode) to complete a light-emitting element.

Embodiment 4

This embodiment deals with the production apparatus of the embodiment 1 or the embodiment 2, being provided with the film-forming chambers based on the printing method for forming the light-emitting materials. Concretely speaking, a relief printing is exemplified which, however, may be replaced by a screen-printing method, as a matter of course. In this embodiment, further, the light-emitting layers of three red, green and blue colors are formed in separate chambers to improve the production apparatus of the embodiment 2. When only one color is needed, the production apparatus may be combined with the production apparatus of the embodiment 1.

The chambers drawn here are not of the same scale. When the production apparatus is to be really constructed, therefore, the volumes must be suitably determined by making reference to the functions of the chambers that will now be described ill this embodiment.

Figure 7:
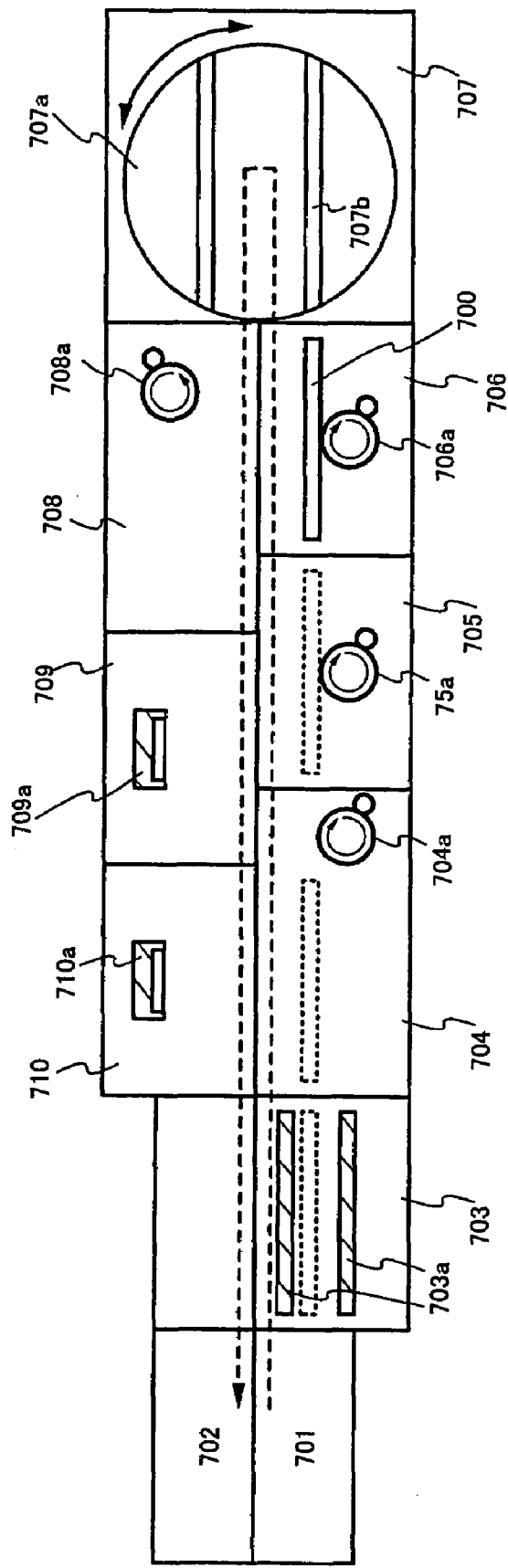
FIG. 7 is a top view of the production apparatus according to the invention.

FIG. 7 illustrates the production apparatus according to this embodiment. The production apparatus illustrated in FIG. 7 includes a loading chamber 701, an unloading chamber 702, as well as, in order of steps, a plasma treatment chamber 703, a film-forming chamber 704 for forming a positive hole injection layer, a film-forming chamber 705 for forming a light-emitting layer for emitting red light, a film-forming chamber 706 for forming a light-emitting layer for emitting green light, a turn chamber 707, a film-forming chamber 708 for forming a light-emitting layer for emitting blue light, a film-forming chamber 709 for forming a cathode, and a film-forming chamber 710 for forming a protection film. The plasma treatment chamber 703 has electrodes 703a, the film-forming chamber 704 has a rolling portion 704a, the film-forming chamber 705 has a rolling portion 705a, the film-forming chamber 706 has a rolling portion 706a, the turn chamber 707 has a turntable 707a and rails 707b, the film-forming chamber 708 has a rolling portion 708a, the film-forming chamber 709 has a sputtering gate 709a, and the film-forming chamber 710 has a sputtering gate 710a.

The above constitution has functions which are nearly the same as those of the production apparatus of the embodiment 2 described with reference to FIG. 5, and is not described again in detail. However, the film-forming chambers 704 to 706 and 708 have been changed, and their internal constitutions will now be described with reference to FIGS. 8A and 8B.

Figure 8A:
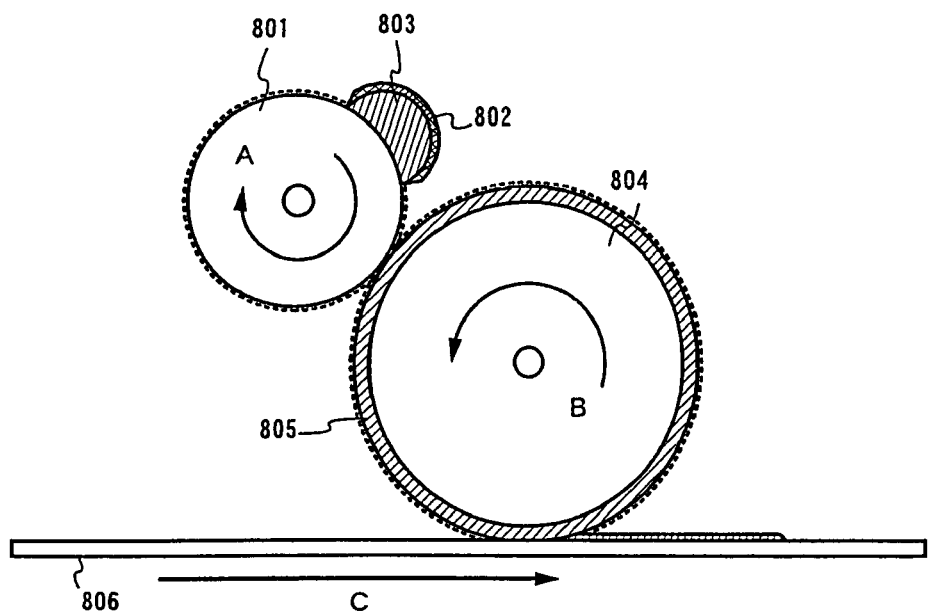
FIGS. 8A and 8B are views illustrating a principle of a printing method.
Figure 8B:
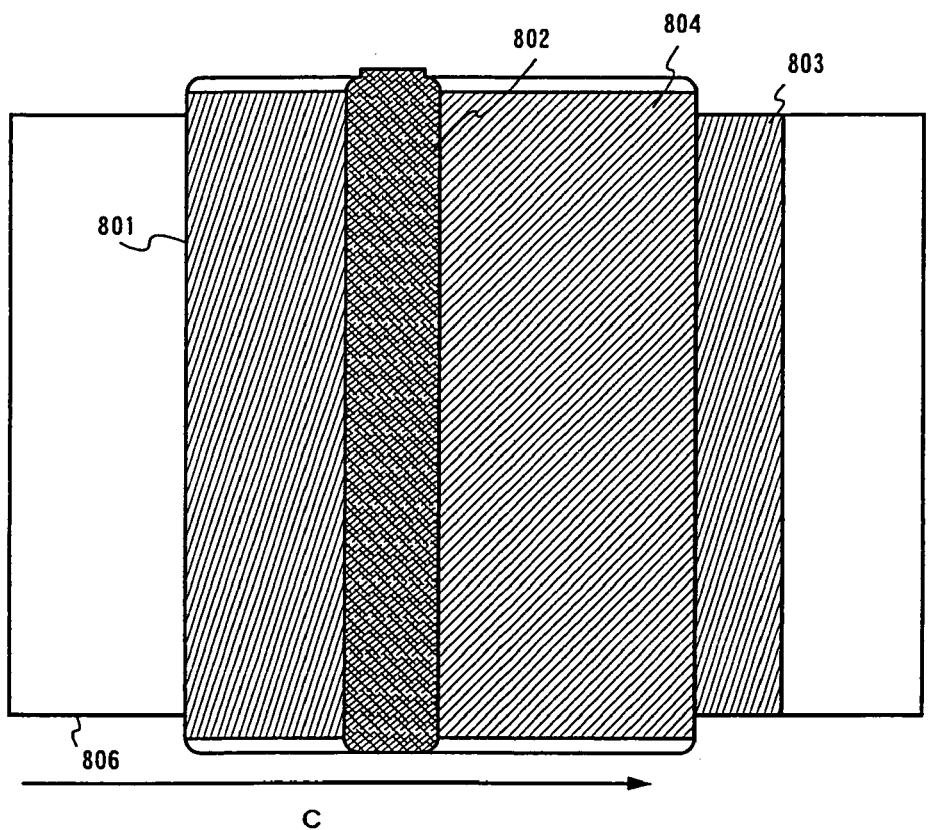

FIGS. 8A and 8B are views illustrating, on an enlarged scale, the constitution in the vicinity of the rolling portion provided in the film-forming chambers 704 to 706 and 708, wherein FIG. 8A is a top view of when the film-forming chamber is viewed from the upper side, and FIG. 8B is a side view of when the film-forming chamber is viewed from the side surface.

In FIGS. 8A and 8B, reference numeral 801 denotes an anilox roll, and 802 denotes a holding portion for holding a solution 803 containing a light-emitting composition (hereinafter simply referred to as solution-holding portion). The solution-holding portion 802 comes in contact with the anilox roll 801 while holding the solution 803 containing the light-emitting composition thereby to feed the solution to the anilox roll 801. Though not illustrated, mesh-like grooves are formed in the surface of the anilox roll 801, and the solution 803 containing the light-emitting composition is held in the mesh-like grooves as the anilox roll 801 rotates in a direction of an arrow A. A dotted line shown on the surface of the anilox roll 801 means that there has been held the solution 803 containing the light-emitting composition.

Reference numeral 804 denotes a printing roll, and 805 denotes a relief printing in which are engraved patterns to be printed (hereinafter simply referred to as relief printing). The anilox roll 801 continues to hold the solution 803 containing the light-emitting composition in the mesh-like grooves while being rotated, whereby the printing roll 804 rotates in a direction of an arrow B, and the relief portion of the relief printing 805 comes in contact with the anilox roll 801 so that the solution 803 containing the light-emitting composition is applied to the relief portion of the relief printing 805.

The solution 803 containing the light-emitting composition is applied (printed) onto a portion where the substrate 806 undergoing a horizontal movement (direction of an arrow C) at the same speed as the printing roll 804 comes into contact with the relief portion of the relief printing 805. Then, the solvent is vaporized by the heat treatment in vacuum, whereby the light-emitting composition only is left to form the positive hole injection layer and the light-emitting layer. Here, the film thickness of the light-emitting material that is finally formed is determined depending upon the viscosity of the solution 803 that contains the light-emitting composition. The viscosity can be adjusted by selecting the solvent to be from 10 to 50 cp and, more preferably from 20 to 30 cp.

Embodiment 5

This embodiment deals with the production apparatus of the embodiment 1 or the embodiment 2, being provided with the film-forming chambers based on the spray method for forming the light-emitting materials. In this embodiment, further, the light-emitting layers of three red, green and blue colors are formed in separate chambers to improve the production apparatus of the embodiment 2. When only one color is needed, the production apparatus may be combined with the production apparatus of the embodiment 1.

The chambers drawn here are not of the same scale. When the production apparatus is to be really constructed, therefore, the volumes must be suitably determined by making reference to the functions of the chambers that will now be described in this embodiment.

Figure 9:
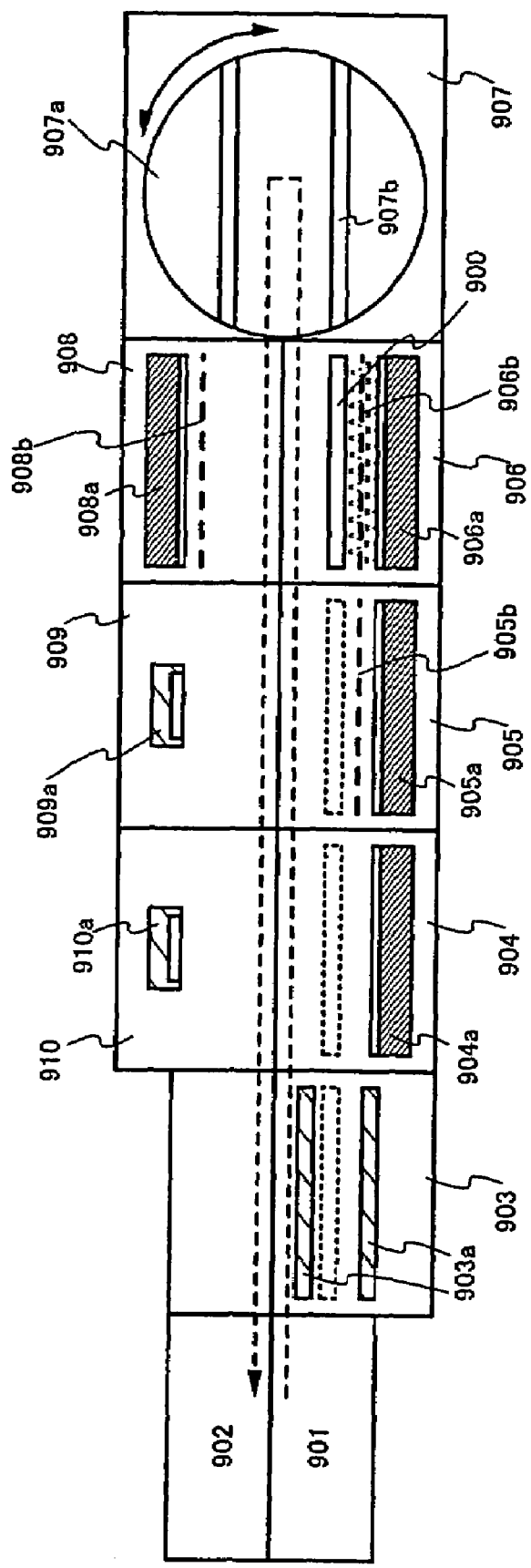
FIG. 9 is a top view of the production apparatus according to the invention.

FIG. 9 illustrates the production apparatus according to this embodiment. The production apparatus illustrated in FIG. 9 includes a loading chamber 901, an unloading chamber 902, as well as, in order of steps, a plasma treatment chamber 903, a film-forming chamber 904 for forming a positive hole injection layer, a film-forming chamber 905 for forming a light-emitting layer for emitting red light, a film-forming chamber 906 for forming a light-emitting layer for emitting green light, a turn chamber 907, a film-forming chamber 908 for forming a light-emitting layer for emitting blue light, a film-forming chamber 909 for forming a cathode, and a film-forming chamber 910 for forming a protection film.

The plasma treatment chamber 903 has electrodes 903a, the film-forming chamber 904 has a spray portion 904a for injecting a solution containing the light-emitting composition, the film-forming chamber 905 has a spray portion 905a and a mask 905b, the film-forming chamber 906 has a spray portion 906a and a mask 906b, the turn chamber 907 has a turntable 907a and rails 907b, the film-forming chamber 908 has a spray portion 908a and a mask 908b, the film-forming chamber 909 has a sputtering gate 909a, and the film-forming chamber 910 has a sputtering gate 910a.

Here, the mask 905b is for shielding the pixels other than those pixels on which are to be formed the light-emitting layer (light-emitting layer R) for emitting red light, the mask 906b is for shielding the pixels other than those pixels on which are to be formed the light-emitting layer (light-emitting layer G) for emitting green light, and the mask 908b is for shielding the pixels other than those pixels on which are to be formed the light-emitting layer (light-emitting layer B) for emitting blue light. These masks make it possible to apply the separate light-emitting layers.

The above constitution has functions which are nearly the same as those of the production apparatus of the embodiment 2 described with reference to FIG. 5, and is not described again in detail. However, the film-forming chambers 904 to 906 and 908 have been changed, and their internal constitutions will now be described with reference to FIGS. 10A and 10B.

Figure 10A:
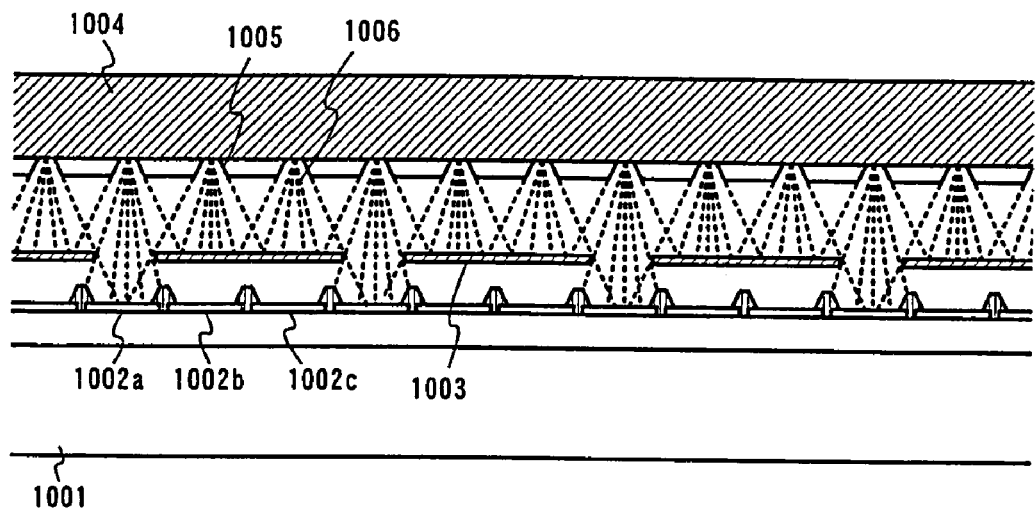
FIGS. 10A and 10B are views illustrating a principle of a spray method.
Figure 10B:
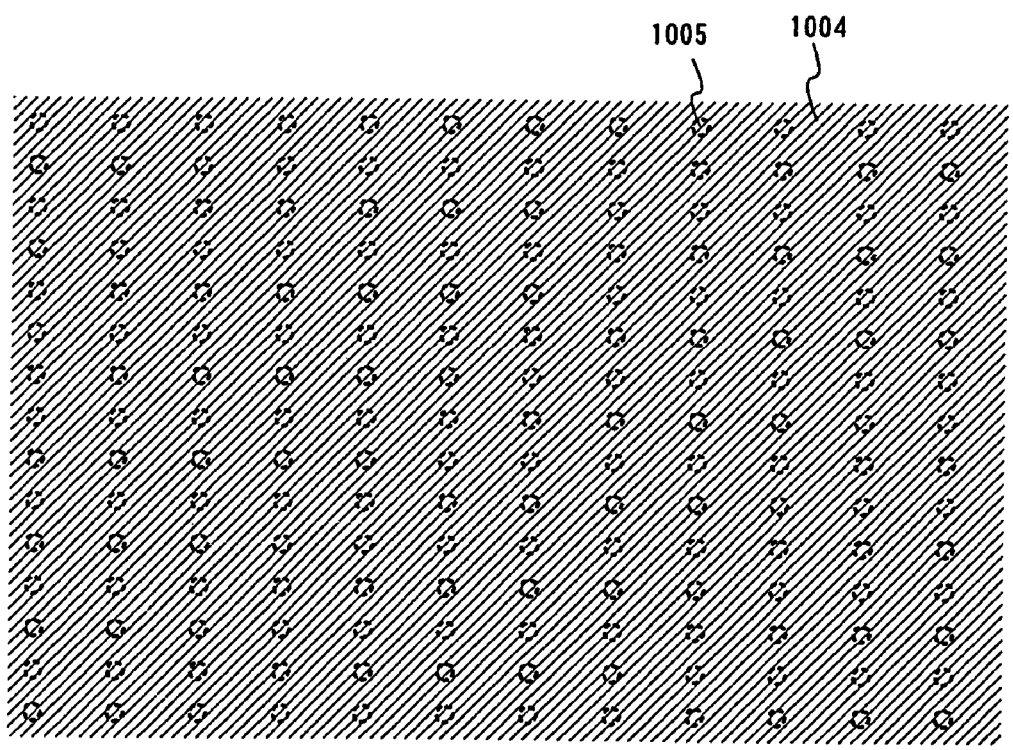

FIGS. 10A and 10B are views illustrating, on an enlarged scale, the constitution of the spray portion provided in the film-forming chambers 904 to 906 and 908, wherein FIG. 10A is a top view of when the film-forming chamber is viewed from the upper side, and FIG. 10B is a side view of when the film-forming chamber is viewed from the side surface.

Figure 2B:
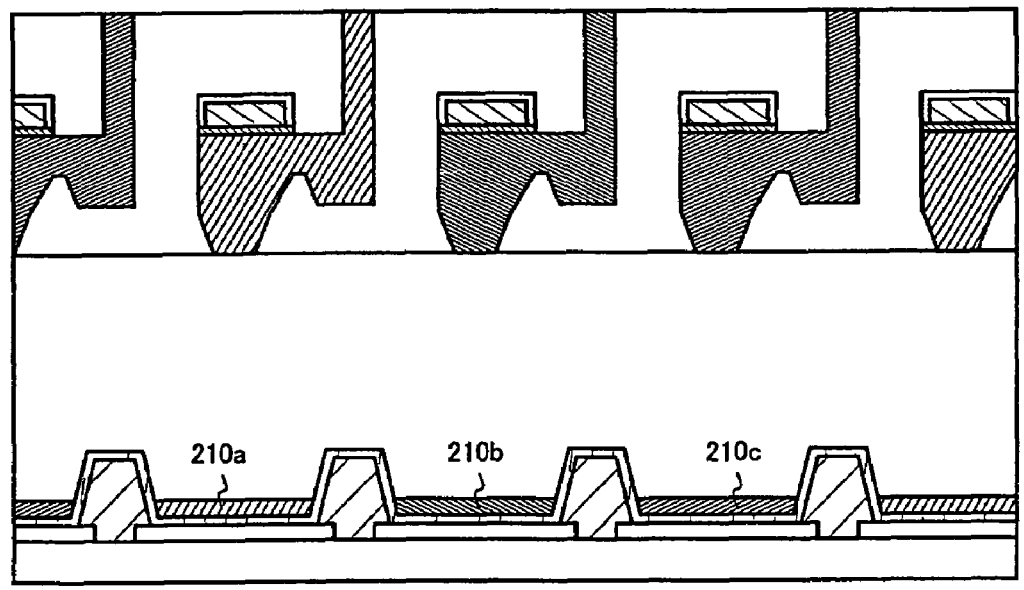

In FIGS. 10A and 10B, reference numeral 1001 denotes a substrate which includes an insulating film for sectionalizing the pixel electrodes and the pixels like the active matrix substrate illustrated in FIGS. 2A and 2B. On the substrates 1001 are existing at least pixels (pixels R) 1002a corresponding to a red color display, pixels (pixels C) 1002b corresponding to a green color display and pixels (pixels B) 1002c corresponding to a blue color display, the pixels being arranged like a matrix.

On the pixels R 1002a, pixels G 1002b and pixels B 1002c, there are arranged masks 1003 and a spray portion 1004. The masks 1003 are so-called shadow masks, and work as shielding masks so that the light-emitting compositions will not be formed on the undesired pixels.

The spray portion 1004 is provided with a plurality of injection ports 1005 (see FIGS. 10A and 10B) through which the solution 1006 containing the light-emitting material is radially injected. In this embodiment, the atomized solution 1006 is radially injected as is called spray method. In the constitution shown in FIG. 10A, the solution 1006 containing the light-emitting material is the one containing a light-emitting material that emits red light, and forms a light-emitting layer on the pixel R 1002a to emit red light. Thereafter, the solvent is vaporized by the heat treatment in vacuum, whereby the light-emitting material only is left to form the light-emitting layer. Here, the solution 1006 containing the light-emitting material must have a viscosity that lies in a range in which the solution can be injected like a mist.

In the above constitution, a so-called turbulence is taking place near the injection ports 1005 due to large kinetic energy that is blown out. When the distance is sufficiently large between the injection ports 1005 and the pixels 1002, however, it is considered that the flow velocity of the solution 1006 containing the light-emitting material that is radially injected becomes very slow to establish a so-called laminar flow. Therefore, a film having a high degree of homogeneity can be formed if a sufficiently large distance is maintained between the injection ports 1005 and the pixels 1002 to establish a laminar flow.

The above constitution makes it possible to spray the solution onto the whole surface of the substrate at one time and, hence, to realize a process maintaining a very high throughput. It is, of course, allowable to employ the spray portion of a linear shape, rectangular shape, elliptic shape or any other slender shape as exemplified by the head portion in the dot jet method of FIG. 3, thereby to employ the spray method while moving the substrate or the spray portion. In this case, the spray portion may scan the substrate from the upper end toward the lower end or from the left end toward the right end.

Embodiment 6

This embodiment modifies the constitution of the film-forming chambers in the production apparatus (FIG. 5) described in the embodiment 2. Concretely speaking, a solution application device based on the spray method is used for the film-forming chamber for forming the positive hole injection layer, and a solution application device based on the liquid jet method is used for the film-forming chamber for forming the light-emitting layer. The description refers to FIGS. 11A and 11B. The portions having the same constitutions as those of FIG. 5 are described by using the same reference numerals.

First, FIG. 11A illustrates a state where the positive hole injection layer is formed on the substrate 500 by the spray method. A film-forming chamber 1101 is provided with a spray portion 1101a for injecting a solution containing the light-emitting composition (an organic compound or an inorganic compound that forms the positive hole injection layer) by the spray method, and where the solution containing the material for forming the positive hole injection layer is radially injected.

FIG. 11B illustrates a state where a light-emitting layer that emits green light is formed, by the liquid jet method (either dot jet method or line jet method) on the substrate 500 on which the positive hole injection layer has been formed. A film-forming chamber 506 is provided with a head portion 506a for injecting a solution containing the light-emitting composition (a light-emitting layer) by the liquid jet method, and where the solution containing the material for forming the light-emitting layer is injected.

In this embodiment, the positive hole injection layer is formed relying upon the spray method and the light-emitting layer is formed relying upon the liquid jet method. This is because, the positive hole injection layer has a function that is common for all pixels, and needs not be separately applied for each of the pixels. Since the positive hole injection layer needs not be separately applied, the spray method is advantageously employed because of its simple operation and a high throughput. The light-emitting layer, on the other hand, must be applied for each of the pixels, and there is employed the liquid jet method that is adapted to separate application. It is allowable to employ a printing method instead of the liquid jet method, as a matter of course.

As described above, the overall throughput is improved as a result of optimizing the means for forming the layer common for all pixels and optimizing the means for forming the layers separately for each of the pixels. This embodiment can be put into practice in combination with any one of the above embodiments 1 to 5 without impairing the advantage of the invention.

Embodiment 7

The embodiment 1 and the embodiment 2 has illustrated the case where the substrate (to be treated) was conveyed in an erected state, i.e., in a state where it was conveyed with its surface to be treated in parallel with the direction of gravity. This embodiment, however, has a different constitution in that the substrate is treated while being tilted with respect to the direction of gravity as will be described with reference to FIGS. 12A to 12D).

FIGS. 12A and 12B are views illustrating the steps of producing the light-emitting materials according to this embodiment, and wherein a head portion 1201 of the solution application device scans along the surface of a substrate 1200. The head portion 1201 injects a solution containing the light-emitting composition in a manner described in the embodiments 1 to 3, and the light-emitting material 1202 is formed through the step of firing. Here, the feature of the embodiment resides in that the substrate 1200 is installed being slightly inclined relative to the direction of gravity. The inclination which is too great impairs the advantage of saving the space of the production apparatus. Accordingly, it is desired that the angle subtended by the film-forming surface of the substrate to be treated and the direction of gravity is from 0 to 30° (and, more preferably, from 0 to 10°).

Another feature of this embodiment is the provision of means for preventing the injection ports of the head portion 1201 from drying after a predetermined step of application has been finished for the whole substrate. Namely, an accommodation portion 1203 for accommodating the head portion 1201 is installed under the substrate 1200, and the interior thereof is filled with a gas obtained by volatilizing the solvent. The gas obtained by volatilizing the solvent (gas containing the solvent component) is introduced through an introduction port 1204, and with which the interior of the accommodation portion 1203 is filled through a plurality of openings 1205 formed in the lower part of the accommodation portion 1203.

Here, "the gas obtained by volatilizing the solvent" is a solvent capable of dissolving the light-emitting material that is to be formed and is, desirably, the same as the solvent for a solution containing the light-emitting composition injected from the head portion 1201. The gas needs not be limited to the same solvent, as a matter of course, and may be suitably changed depending upon the kind of the light-emitting material to be formed.

Next, FIGS. 12C and 12D illustrate the state of the head portion 1201 at a moment after the step of forming the light-emitting material has been finished. As shown in FIGS. 12C and 12D, the head portion 1201 is accommodated in the accommodation portion 1203 so as to be completely concealed therein, and is exposed to the atmosphere of the solvent gas. Here, the accommodation portion 1203 may be provided with a closure portion. After the head portion 1201 is accommodated, therefore, the accommodation portion 1203 may be covered with the closure to suppress the solvent component from diffusing toward the outer side. The head portion is secured by a support member that is not shown so as to perform the scanning operation. Therefore, the closure avoids the support member, as a matter of course.

According to this embodiment as described above, the feature resides in that after the step of forming the light-emitting material has been finished, the head portion is exposed to the atmosphere filled with the solvent capable of dissolving the light-emitting material that is to be formed. At the injection portions of the head portion 1201, therefore, the light-emitting composition dissolves in the solvent, and there occurs no restriction due to drying. Namely, there is established a non-drying environment even when the injection of the light-emitting composition is interrupted. Unlike the conventional so-called ink jet system, there is no need of continuing the injection of solution at all times to prevent drying, decreasing the ratio of wasteful injection and improving the utilization efficiency of the light-emitting composition.

This embodiment can be combined with the production apparatus including the constitution of any one of the embodiments 1 to 3 and 6.

Embodiment 8

Figure 13A:
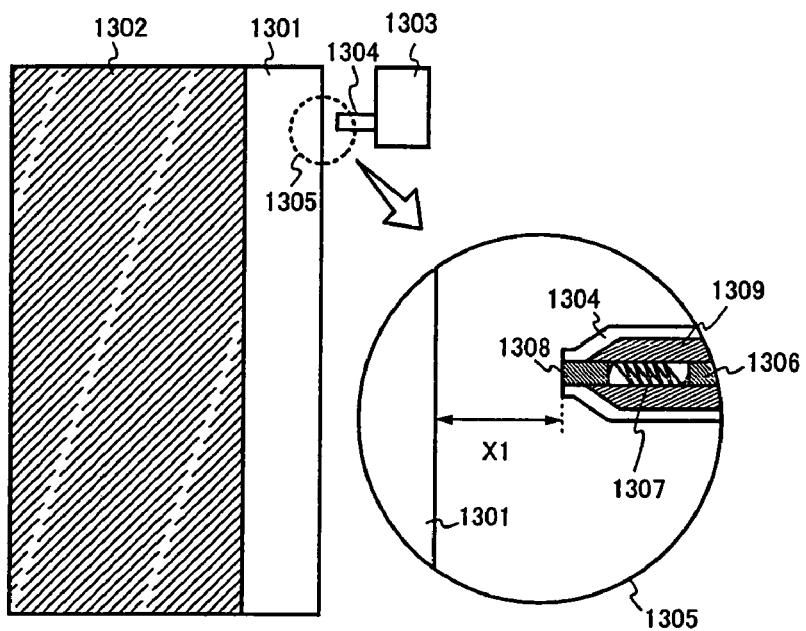
FIGS. 13A and 13B are views illustrating the structure of a nozzle used for the line jet method.
Figure 13B:
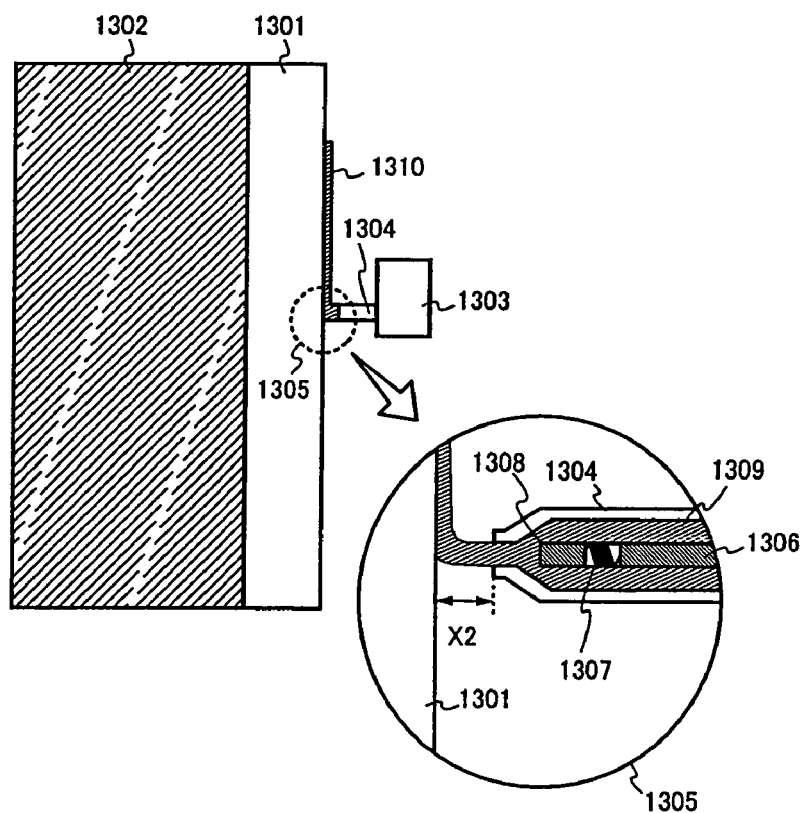

This embodiment deals with the constitution of the head portion of the solution application apparatus based on the liquid jet method used for the production apparatus of the invention with reference to FIGS. 13A and 13B. In FIG. 13A, a substrate 1301 is supported by a susceptor 1302 made of a magnetic material, and is vertically installed (which includes an inclined installation). The head portion 1303 of the solution application device is provided close to the front surface of the substrate 1301. An end of the nozzle (injection port) 1304 on an enlarged scale is encircled by a dotted line 1305. The interior of the nozzle has a hollow structure, and includes a core 1306 secured therein, and a cap (hereinafter called magnetic cap) 1308 made of a magnetic material which is coupled to the core 1306 via a resilient member (spring in this embodiment) 1307. The outer side of the hollow structure is filled with a solution 1309 containing the light-emitting composition.

The material of the magnetic cap 1308 is so selected that a repulsion is produced relative to the susceptor 1302 made of a magnetic material. In the case of FIG. 13A, the distance X1 between the substrate 1301 and the magnetic cap 1308 is so selected that the repulsion does not effectively work between the susceptor 1302 and the magnetic cap 1308, the distance being determined depending upon the magnetic material, thickness of the substrate and the like. When the repulsion does not effectively work between the susceptor 1302 and the magnetic cap 1308, the magnetic cap 1308 is pushed by the resilient member 1307 and is stuffed at the end of the nozzle 1304, so that the solution 1309 containing the light-emitting composition will not be injected.

After the start of the application of solution, on the other hand, the distance between the substrate 1301 and the magnetic cap 1308 is shortened to X2 as shown in FIG. 13B. The distance X2 is the one in which the repulsion works sufficiently between the susceptor 1302 and the magnetic cap 1308. Due to this repulsion, the magnetic cap 1308 compresses the resilient member 1307 to push it into the hollow structure. Then, a space is maintained at the end of the nozzle 1304, and the solution 1309 containing the light-emitting composition is injected. Thus, the solution 1309 containing the light-emitting composition is applied onto the surface of the substrate 1301, the solvent is volatilized under a reduced pressure, or the solvent is volatilized being heated by the substrate 1301 thereby to form a light-emitting material 1310.

By forming the susceptor and the cap at the end of the nozzle by using magnetic materials of such a relationship that produces a repulsion relative to each other, it is allowed to establish a constitution that applies the solution contained therein when they are brought close to each other up to a predetermined distance and, hence, to maintain uniformity in the distance between the substrate and the head portion (nozzle in a strict sense). This technology is effective particularly in applying the solution onto the substrate having rugged surfaces.

This embodiment can be combined with the production apparatus having any constitution of the embodiments 1 to 3, 6 and 7.

Embodiment 9

This embodiment deals with technology for preserving the solution containing the light-emitting composition without exposing it to the open air in the production apparatuss of the embodiments 1 to 8.

FIG. 14 is a sectional view of a container (canister) for storing (preserving) the solution containing the light-emitting composition in the solution application device. It is desired that the container 1401 is made of a material having tightness and, particularly, having a sufficiently large resistance against the permeation of oxygen and moisture and is, desirably, made of a stainless steel or aluminum. It is further desired that the inner surfaces thereof are finished like a mirror surface. As required, further, the inner surfaces and/or the outer surfaces thereof may be coated with a silicon nitride film, a diamond-like carbon film or any other insulating film permitting oxygen to pass through little. This is to prevent the solution 1402 containing the light-emitting composition in the container 1401 from being deteriorated.

Reference numeral 1403 denotes an inlet port for introducing nitrogen, a rare gas or any other inert gas into the container 1401, and through which the inert gas is introduced to pressurize the interior of the container. Reference numeral 1404 denotes an outlet port from where the solution 1402 containing the light-emitting composition that is pressurized is sent into the head portion of the solution application device (not shown). The inlet port 1403 and the outlet port 1404 may be formed of a material different from that of the container 1401, or may be formed integrally therewith.

Reference numeral 1406 denotes an inlet pipe coupled to the inlet port 1403. To practically introduce the inert gas, an end of the inlet pipe 1406 is coupled to the inlet port 1403 to thereby introduce the inert gas. Similarly, an end of the outlet pipe 1407 is coupled to the outlet port 1404 to drain the solution 1402 containing the light-emitting composition. In the drawing, the pipes are expressed as dotted lines since they are detachable.

For example, the head portion of the embodiments 1 and 2 is attached to an extended end of the outlet pipe 1407. In the case of the embodiment 1, the piezoelectric elements 206a to 206c are oscillated in a state where the interior of the container 1401 is pressurized with the inert gas, so that the solution 1402 containing the light-emitting composition is blown out intermittently. In the case of the embodiment 2, the solution can be continuously applied so far as the interior of the container 1401 is being pressurized with the inert gas. When the application of pressure is discontinued, the solution 1402 containing the light-emitting composition ceases to blow out.

In this embodiment, further, the feature resides in that the solution 1402 containing the light-emitting composition is transported in a state of being kept off the atmosphere at all times from when it is introduced into the container 1401 until when the container 1401 is attached to the solution application device. That is, the manufacturer of the solution 1402 containing the light-emitting composition introduces the solution 1402 containing the light-emitting composition into the container 1401, transports it maintaining air-tightness without exposing it to the atmosphere, so as to be directly supplied to the solution application device. This was done in view of that the light-emitting composition has weak resistance against oxygen and moisture and is easily deteriorated. The light-emitting composition after the preparation is preserved maintaining the purity of just after the preparation until it is applied, suppressing the deterioration of the light-emitting composition and maintaining improved reliability of the light-emitting device.

The container of the embodiment shown in FIG. 14 is only a preferred example for transporting the solution containing the light-emitting composition maintaining the purity thereof, but is not to limit the container that can be used in the invention.

Embodiment 10

In this embodiment, a feature resides in the use of light of a long wavelength region as means for firing the light-emitting material formed by the methods of the embodiments 1 to 5. The constitution of this embodiment will now be described with reference to FIGS. 15A to 15C. FIG. 15A is a top view of the heating method according to the embodiment, FIG. 15B is a sectional view along A-A', and FIG. 15C is a sectional view along B-B'.

In FIG. 15A, reference numeral 1501 is a substrate which permits the transmission of light having wavelengths at least longer than those of visible rays (typically, light having wavelengths longer than 300 nm) and on which thin-film transistors and pixel electrodes are formed. The substrate 1501 is conveyed by a conveyer mechanism that is not shown in a direction of an arrow 1502.

A head portion 1503 of the solution application device is installed over the front surface of the substrate 1501, and the solution containing the light-emitting composition is applied in a manner as described in the embodiments 1 to 3. The light-emitting composition 1504 that is applied is heated by light (hereinafter referred to as lamp light) emitted from a lamp 1505 installed under the back surface side of the substrate 1501, whereby the solvent is volatilized (fired) to form a light-emitting material 1506. That is, the light-emitting composition 1504 that is applied is fired successively by lamp light to assume the form of a thin film.

Namely, due to the motion of the substrate 1501, the head portion 1503 and the lamp 1505 are relatively scanned in a direction opposite to the direction in which the substrate 1501 moves. It is allowable to secure the substrate 1501 and to move the head portion 1503 and the lamp 1505, as a matter of course. In this case, the head portion 1503 is set to be scanned, first, at all times. As a result, the application of the solution by the head portion 1503 and the subsequent firing by lamp light are effected nearly simultaneously, offering an advantage which is substantially equal to omitting the step of firing.

Light that can be used as lamp light has a wavelength which effects the heating only without destroying the composition of the light-emitting material 1506. Concretely speaking, it is desired that light has a wavelength longer than 400 nm, i.e., has a wavelength longer than that of infrared rays. For example, there can be used electromagnetic waves over a wavelength region of from 1 μm up to 10 cm, which is from far ultraviolet rays through up to microwaves. It is particularly desired to use far ultraviolet rays (typically, wavelengths of from 4 to 25 μm) even from the standpoint of handling.

The embodiment here has dealt with an example of completing the application over the whole surface by simply scanning the head portion 1503 only one time. It is, however, also allowable to reciprocally move the substrate 1501 a plural number of times to apply the solution in an overlapped manner a plural number of times, followed by the scanning with the lamp 1505. In this case, the lamp 1505 is maintained turned off while the head portion 1503 is scanning for the first several times and, then, the lamp 1505 is energized to emit light to effect the scanning in synchronism with the last scanning of the head portion 1503.

Though this embodiment has dealt with the application of the solution by the liquid jet method, the embodiment can further be applied to the case of applying the solution by the spray method by using the spray portion which is of a linear shape, a rectangular shape, an elliptic shape or any other slender shape.

Upon the irradiation with light of a wavelength longer than those of infrared rays by using a source of light such as a lamp as heating means in the step of firing, it is made possible to apply the light-emitting composition and to fire the light-emitting composition almost at the same time to establish a system from which the step of firing is substantially omitted. This improves the throughput of the step of producing light-emitting devices.

Embodiment 11

Figure 16:
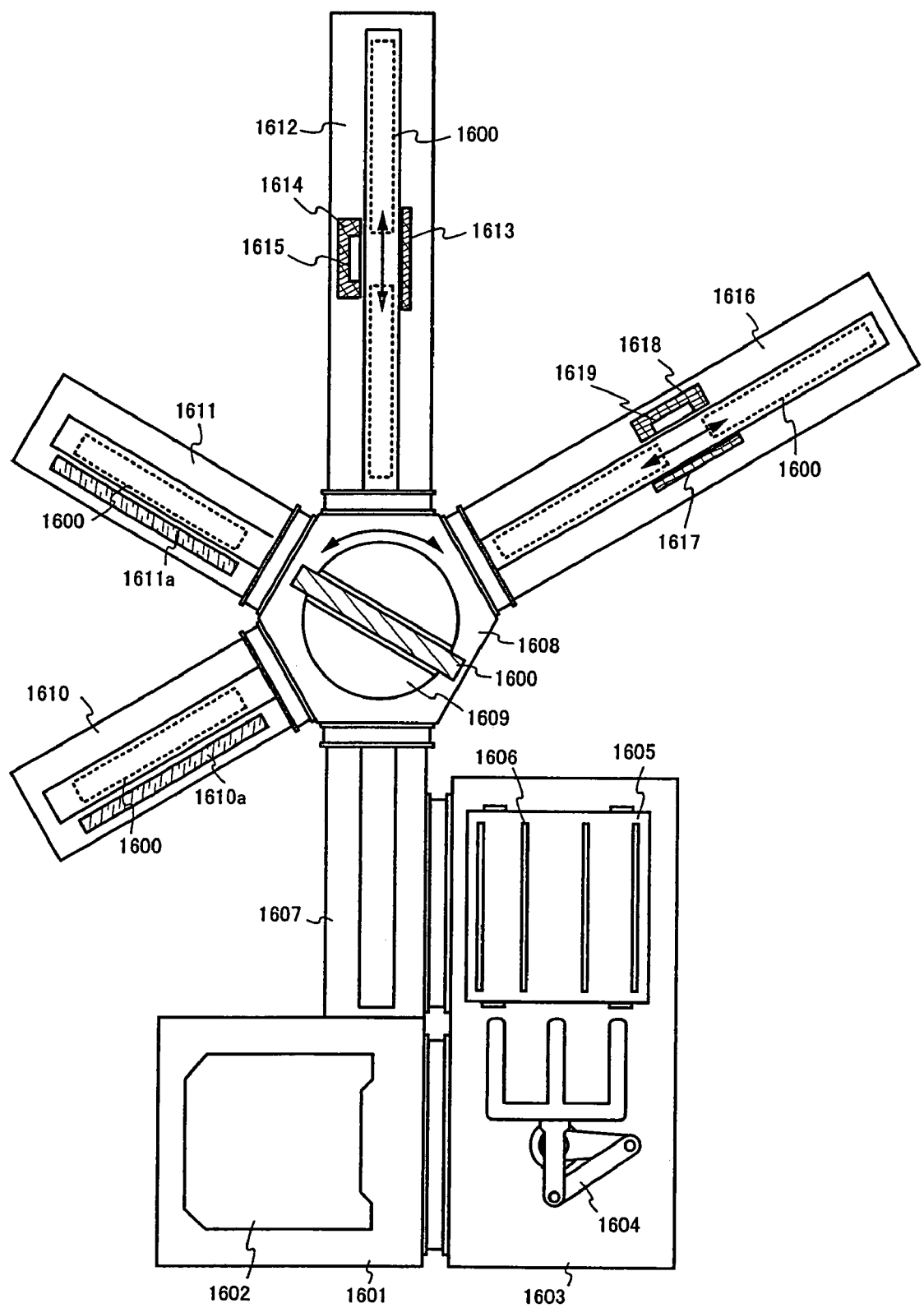
FIG. 16 is a top view of the production apparatus according to the invention.

This embodiment deals with the production apparatus of the present invention which is of the cluster tool system (also called multi-chamber system) with reference to FIG. 16. Each chamber is coupled to one another through a gate valve to maintain air-tightness.

In FIG. 16, a carrier 1602 for conveying the substrate is installed in a stock chamber 1601. The stock chamber 1601 is coupled to a conveyer chamber 1603 through a gate valve, and the substrate mounted on the carrier 1602 is conveyed by a conveyer arm 1604 and is installed on a substrate-mounting plate 1605. At this moment, the substrate is, first, placed on a pusher pin 1606 which is, then, lowered, so that the substrate is installed on the substrate-mounting plate 1605.

After the substrate is secured thereon, the substrate-mounting plate 1605 is erected by 90°, is moved into the loading/unloading chamber 1607 where the substrate is handed over to the susceptor 1600. In FIG. 16, the susceptor 1600 drawn by a dotted line means that the susceptor is located at the position that is drawn at the time of treating the substrate, but moves together with the substrate as the process proceeds and is no longer existing at the position drawn by the dotted line.

The substrate handed over in the loading/unloading chamber 1607 moves together with the susceptor 1600 along the rail, and is conveyed into a common chamber 1608 coupled through the gate valve. A turntable 1609 is provided in a common chamber 1608. After the susceptor 1600 is placed thereon, the turntable 1609 turns to select a chamber which is coupled to the common chamber through the gate valve and in which the treatment is to be effected next.

The production apparatus according to this embodiment includes, as chambers for effecting the treatments, a film-forming chamber (HIL film-forming chamber) 1610 for forming a positive hole injection layer (HIL), a film-forming chamber (light-emitting layer-forming chamber) 1611 for forming a light-emitting layer, a film-forming chamber (sputter film-forming chamber) 1612 for forming a film of cathode by sputtering, and a film-forming chamber (sputter film-forming chamber) 1616 for forming a protection film by sputtering method. The film-forming chambers 1610 and 1611 for forming light-emitting materials are both provided with the solution application device based on the spray method described in the embodiment 5, and in which the solutions containing the light-emitting compositions are radially injected to form films. These chambers are provided with spray portions 1610a and 1611a of the solution application devices.

The sputter film-forming chamber 1612 is provided with electrodes 1613, 1614 and a target 1615, and the sputter film-forming chamber 1616 is provided with electrodes 1617, 1618 and a target 1619, which are all of a cylindrical shape or of an elliptic shape. The substrate mounted on the susceptor 1600 is conveyed in a direction of an arrow, and on which a film is formed as it passes by the target 1615 or 1619. At this moment, the sputtering method may be either the DC (direct current) sputtering method or the RF (alternating current) sputtering method.

The substrate (susceptor) treated through the chambers returns back to the loading/unloading chamber 1607, and is accommodated in the carrier 1602 passing through the substrate-mounting plate 1605. Thus, the steps are completed up to forming the cathode of the light-emitting element. The constitution of the light-emitting material is not limited to the one of this embodiment only; i.e., this embodiment can be applied to the light-emitting material of any constitution by changing the number of the chambers, changing the contents of treatment in the film-forming chambers or by effecting any other change. That is, the light-emitting layers of red, green and blue colors can be separately applied like in the embodiment 2.

Further, the embodiment may be furnished with the solution application device based on the liquid jet method described in the embodiments 1 to 3 and/or may be furnished with the solution application device based on the printing method described in the embodiment 4, or may be combined with the constitution of any one of the embodiments 6 to 10.

Embodiment 12

As the light-emitting materials described in the embodiments 1 to 5, there can be exemplified a light-emitting layer, a positive hole injection layer, a positive hole-transporting layer, a positive hole-blocking layer; an electron injection layer, an electron-transporting layer, an electron-blocking layer, or a stacked layer thereof, which may be constituted by organic compounds only or a composite of a lamination of an organic compound and an inorganic compound.

Accordingly, this embodiment deals with an example of using a composite of an organic compound and an inorganic compound as a light-emitting material in the light-emitting device of the invention. U.S. Pat. No. 5,895,932 discloses a hybrid structure obtained by laminating organic compounds and inorganic compounds. Namely, this patent discloses technology according to which $Alq_3$ (tris-8-quinolinolatoaluminum complex) which is an organic compound is irradiated with ultraviolet light (wavelength of 380 nm) emitted from a diode of an inorganic compound to take out light emitted due to a phenomenon called photoluminescence. This technical idea is radically different from that of the light-emitting material or composite described in this embodiment.

Among the organic compounds, a high-molecular organic compound (hereinafter called organic polymer) has a high heat resistance, is easy to handle, and is used as a solute in the method of forming a film by applying a solution. This embodiment deals with the use of a composite of these organic polymer and inorganic compound as a light-emitting material.

The light-emitting materials can be formed by laminating an organic polymer and an inorganic compound according to the following four typical patterns:

(a) A combination of a positive hole injection layer (or a positive hole transporting layer) of an inorganic compound and a light-emitting layer of an organic polymer;
(b) A combination of an electron injection layer (or an electron-transporting layer) of an inorganic compound and a light-emitting layer of an organic polymer;
(c) A combination of a light-emitting layer of an inorganic compound and a positive hole injection layer (or a positive hole-transporting layer) of an organic polymer; and
(d) A combination of a light-emitting layer of an inorganic compound and an electron injection layer (or an electron-transportation layer) of an organic polymer.

Further, the light-emitting materials can be formed by mixing an organic polymer and an inorganic compound according to the following three typical patterns:

(e) A combination of a light-emitting layer of an organic polymer having carrier-transporting property and the organic polymer in which an inorganic compound is mixed;

(f) A mixture of an organic polymer having carrier-transporting property of the same polarity (n-type or p-type) and an inorganic compound as a light-emitting layer; and (g) A mixture of an organic polymer having carrier-transporting property and an inorganic compound having carrier-accepting property.

The above constitution (g) may be a combination of, for example, an organic polymer having positive hole-transporting property in which is mixed an inorganic compound having electron-accepting property. In this case, the inorganic compound having electron-accepting property works to receive electrons from the organic polymer, whence positive holes are generated in the organic polymer, and the positive holes are transported thereby to create transporting property.

In the above constitutions (a) to (g), a p-type semiconductor material such as NiO (nickel oxide) can be used as the positive hole injection layer or the positive hole-transporting layer of the inorganic compound, an n-type semiconductor material such as ZnO (zinc oxide) or $TiO_2$ (titanium dioxide) can be used as the electron injection layer or the electron-transporting layer of the inorganic compound, and ZnS (zinc sulfide) or CdS (cadmium sulfide) can be used as the light-emitting layer of the inorganic compound.

In the above constitution (b), for example, a PPV (polyparaphenylene vinylene) is used as the organic polymer, CdS is used as the inorganic compound, and these components are formed by applying the solution thereof. In forming CdS, in this case, fine particles of CdS of the order of nanometers (fine particles of from several nm to several tens of nm, hereinafter the same) are applied being dispersed in a solvent. The application step of this invention may be put into practice in this case. It is also allowable to use the n-type semiconductor material such as ZnO or $TiO_2$ instead of CdS or to use the p-type semiconductor material such as NiO.

In the above constitution (e), for example, a PVK (polyvinylcarbazole) is used as the organic polymer, CdS is used as the inorganic compound, and these components are formed by applying the solution thereof. In this case, the CdS serves as a center of emitting light. In forming CdS, fine particles of CdS are applied being dispersed in a solvent. The application step of this invention may be put into practice in this case. It is also allowable to use an inorganic compound such as ZnS instead of CdS. The CdS and ZnS are inorganic compounds which easily form fine particles of the order of nanometers, and are very desirable materials when it is a prerequisite to apply a solution thereof as in this invention.

In the above constitution (g), further, a PC (polycarbonate) is used as the organic polymer, a TPD (triphenyldiamine) which is a positive hole-transporting inorganic compound and an alkoxide of Ti are mixed into the PC so as to be applied in the form of a solution. Then, the light-emitting material of a mixture of PC, TPD and $TiO_2$ is formed by the hydrolysis and vacuum heating. In forming CdS, in this case, fine particles of CdS are applied being dispersed in a solvent. The application step of this invention may be put into practice in this case.

By using various organic compounds and inorganic compounds, as described above, it is made possible to prepare a composite light-emitting material by employing the production method of this invention.

The light-emitting material (composite) of this embodiment can be prepared by any one of the methods of the embodiments 1 to 8 and 10, and can be preserved even by using the container of the embodiment 9.

Embodiment 13

Figure 17A:
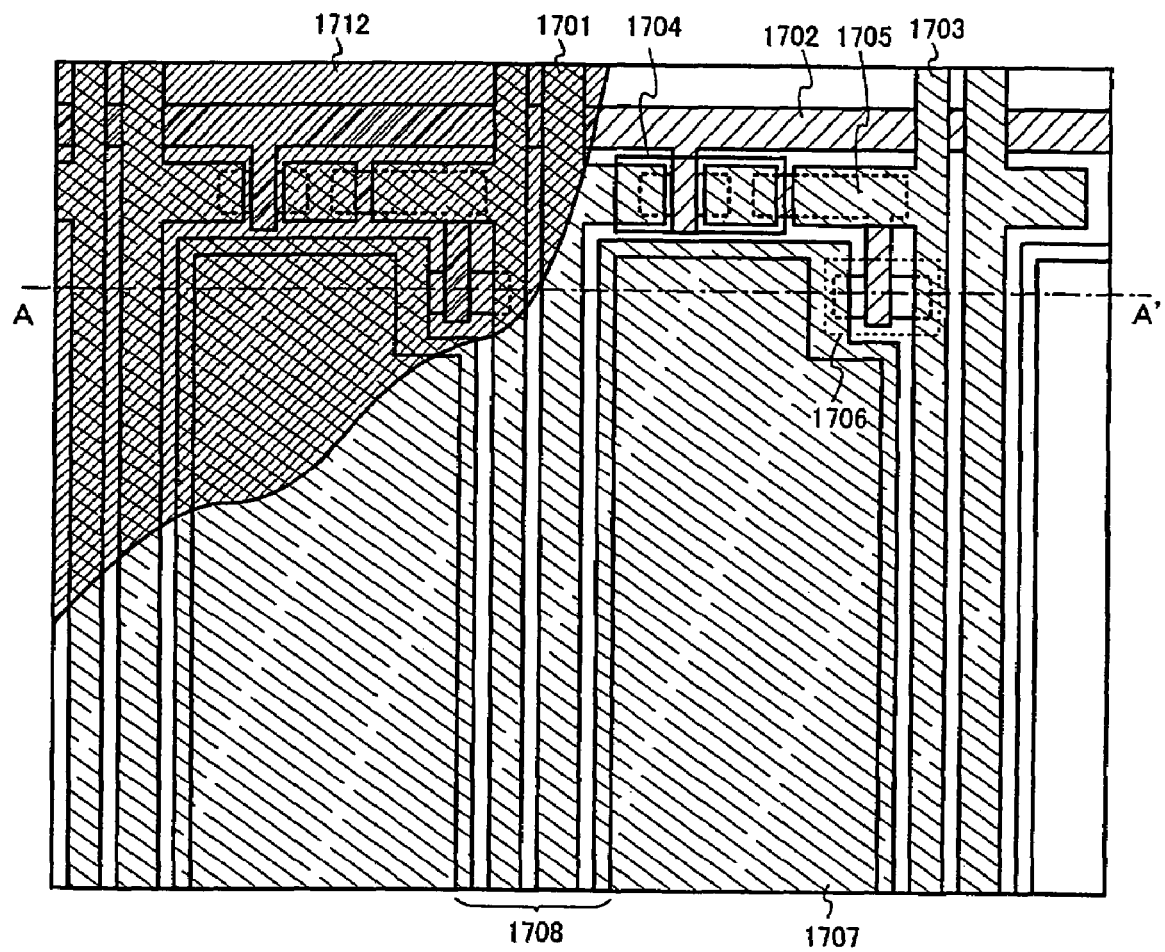
FIGS. 17A and 17B are views illustrating a constitution of the light-emitting device obtained by the invention.

This embodiment deals with a light-emitting device produced by putting the invention into practice, and is described with reference to FIGS. 17A and 17B. In the pixel constitution shown in FIG. 17A, reference numeral 1701 denotes a data signal line, 1702 denotes a gate signal line, 1703 denotes a power source line, 1704 denotes a thin-film transistor for switching (also referred to as switching TFT, the same holds hereinafter), 1705 denotes a capacitor for holding electric charge, 1706 denotes a thin-film drive transistor (referred to as drive TFT, the same holds hereinafter) for feeding a current to the light-emitting element, and 1707 denotes a pixel electrode connected to the drain of the drive TFT, the pixel electrode 1707 serving as an anode of the light-emitting element. Further, reference numeral 1712 is an opposing electrode which serves as a cathode of the light-emitting element.

Figure 17B:
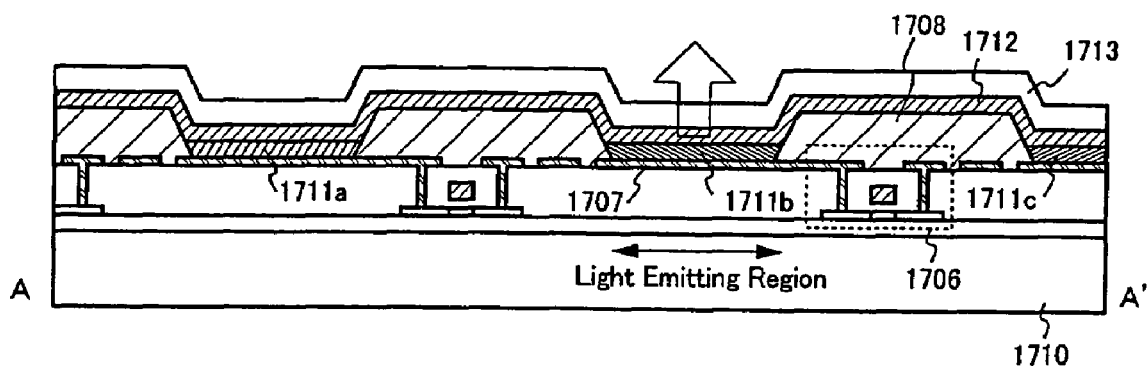

FIG. 17B is a sectional view along A-A'. In FIG. 17B, reference numeral 1710 denotes a substrate which may be a glass substrate, a quartz substrate, a plastic substrate or any other light-transmitting substrate. The drive TFT 1706 is formed on the substrate 1710 relying upon a semiconductor process. Further, an insulator 1708 patterned like a lattice is formed so as to cover an end of the pixel electrode 1707 that is so formed as to be connected to the drive TFT 1706, and to cover at least the drive TFT and the switching TFT.

On the pixel electrodes 1707 are formed light-emitting materials 1711a to 1711c, an opposing electrode 1712 serving as a cathode, and a passivation film 1713. The light-emitting materials 1711a to 1711c stand for a carrier injection layer, a carrier-transporting layer, a carrier-blocking layer, a light-emitting layer, or any other organic compound or inorganic compound that contributes to recombining carriers, or a laminate thereof. The laminated structure and materials of these light-emitting materials 1711a to 1711c may be the known constitution and materials.

For example, there may be included an inorganic positive hole injection layer (which other wise may be called an inorganic positive hole-transporting layer) having a high resistance (resistivity of from 1 to $1 \times 10^{11}$ Ω·cm) as at least one layer of the light-emitting material as disclosed in JP-A-2000-268967 and JP-A-2000-294375. The inorganic positive hole injection layer contains, as first components, alkali metal elements selected from Li, Na, K, Rb, Cs and Fr, or alkaline earth metal elements selected from Mg, Ca and Sr, or lanthanide-type elements selected from La and Ce, and contains, as second components, the elements selected from Zn, Sn, V, Ru, Sm and In. As at least one layer of the light-emitting material, further, there may be included an inorganic electron-transporting layer having a high resistance (resistivity of 1 to $1 \times 10^{11}$ Ω·cm). The inorganic positive hole injection layer contains metal elements selected from Au, Cu, Fe, Ni, Ru, Sn, Cr, Ir, Nb, Pt, W, Mo, Ta, Pd and Co or oxides, carbides, nitrides, silicates or borates thereof. Further, main component of the inorganic positive hole injection layer may be an oxide of silicon, germanium or silicon germanium. By using a stable inorganic insulating film as part of the light-emitting material as described above, reliability of the light-emitting element can be enhanced.

As the opposing electrode 1712, further, there can be used an aluminum film containing an element belonging to the Group 1 or Group 2 of periodic table or a thin silver film. In this embodiment, light emitted from the light-emitting materials 1711a to 1711c must be transmitted and, hence, the film thickness is desirably not larger than 50 nm. As the passivation film 1713, further, there can be used a silicon nitride film, an aluminum nitride film, a diamond-like carbon film or an insulating film exhibiting high blocking property against moisture and oxygen.

In producing the light-emitting device of the above constitution, the present invention makes it possible to produce the light-emitting device at a low cost, through a simple method and featuring a high throughput, as well as to improve reliability of the light-emitting device.

Embodiment 14

Figure 18A:
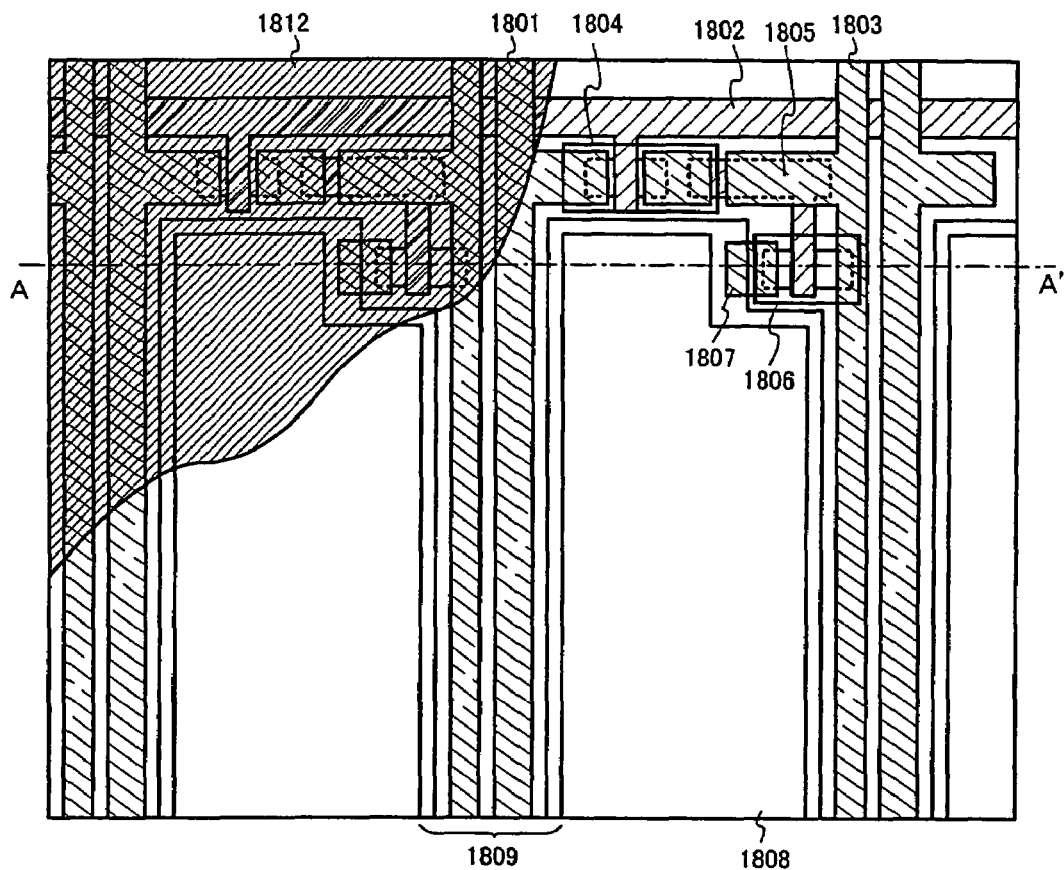
FIGS. 18A and 18B are views illustrating a constitution of the light-emitting device obtained by the invention.

This embodiment deals with a light-emitting device produced by putting the invention into practice, and is described with reference to FIGS. 18A and 18B. In the pixel constitution shown in FIG. 18A, reference numeral 1801 denotes a data signal line, 1802 denotes a gate signal line, 1803 denotes a power source line, 1804 denotes a switching TFT, 1805 denotes a capacitor for holding electric charge, 1806 denotes a drive transistor, 1807 denotes a drain electrode of the drive TFT, and 1808 denotes a pixel electrode connected to the drain electrode of the drive TFT, the pixel electrode 1808 serving as an anode of the light-emitting element. It is desired that the pixel electrode 1808 is formed of an electrically conducting film which is transparent for the visible rays so that light emitted from the light-emitting material passes therethrough and is, hence, formed of an oxide conductor film such as of ITO (a compound of indium oxide and tin oxide) or a compound of indium oxide and zinc oxide. Further, reference numeral 1812 is an opposing electrode which serves as a cathode of the light-emitting elements.

Figure 18B:
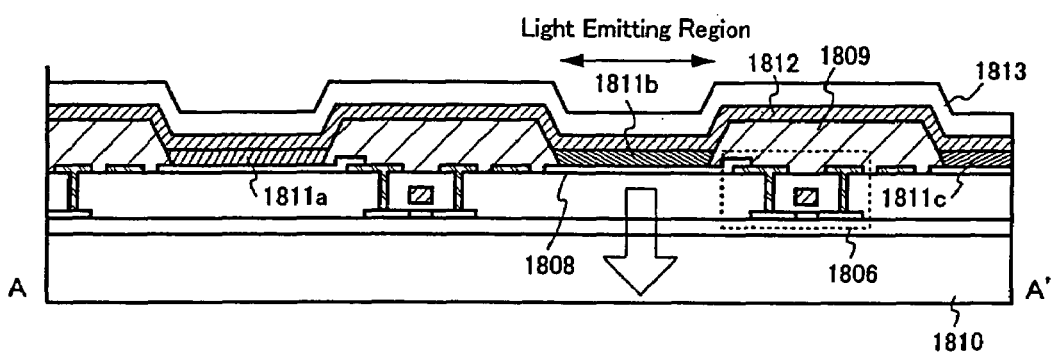

FIG. 18B is a sectional view along A-A'. In FIG. 18B, reference numeral 1810 denotes a substrate which may be a glass substrate, a quartz substrate, a plastic substrate or any other light-transmitting substrate. The drive TFT 1806 is formed on the substrate 1810 relying upon a semiconductor process. Further, an insulator 1809 patterned like a lattice is formed so as to cover an end of the pixel electrode 1808 that is so formed as to be connected to the drive TFT 1806, and to cover at least the drive TFT and the switching TFT.

On the pixel electrodes 1808 are formed light-emitting materials 1811a to 1811c, an opposing electrode 1812 serving as a cathode, and a passivation film 1813. The light-emitting materials 1811a to 1811c stand for a carrier injection layer, a carrier-transporting layer, a carrier-blocking layer, a light-emitting layer, or any other organic compound or inorganic compound that contributes to recombining carriers, or a laminate thereof. The laminated structure and materials of these light-emitting materials 1811a to 1811c may be the known constitution and materials.

For example, there may be included an inorganic positive hole injection layer (which otherwise may be called an inorganic positive hole-transporting layer) having a high resistance (resistivity of from 1 to $1 \times 10^{11}$ Ω·cm) as at least one layer of the light-emitting material as disclosed in JP-A-2000-268967 and JP-A-2000-294375. The inorganic positive hole injection layer contains, as first components, alkali metal elements selected from Li, Na, K, Rb, Cs and Fr, or alkaline earth metal elements selected from Mg, Ca and Sr, or lanthanide-type elements selected from La and Ce, and contains, as second components, the elements selected from Zn, Sn, V, Ru, Sm and In. As at least one layer of the light-emitting material, further, there may be included an inorganic electron-transporting layer having a high resistance (resistivity of 1 to $1 \times 10^{11}$ Ω·cm). The inorganic positive hole injection layer contains metal elements selected from Au, Cu, Fe, Ni, Ru, Sn, Cr, Ir, Nb, Pt, W, Mo, Ta, Pd and Co or oxides, carbides, nitrides, silicates or borates thereof. Further, main component of the inorganic positive hole injection layer may be an oxide of silicon, geranium or silicon germanium. By using a stable inorganic insulating film as part of the light-emitting material as described above, reliability of the light-emitting element can be enhanced.

As the opposing electrode 1812, further, there can be used an aluminum film containing an element belonging to the Group 1 or Group 2 of periodic table or a thin silver film. As the passivation film 1813, further, there can be used a silicon nitride film, an aluminum nitride film, a diamond-like carbon film or an insulating film exhibiting high blocking property against moisture and oxygen.

In producing the light-emitting device of the above constitution, the present invention makes it possible to produce the light-emitting device at a low cost, through a simple method and featuring a high throughput, as well as to improve reliability of the light-emitting device.

Embodiment 15

Figure 19A:
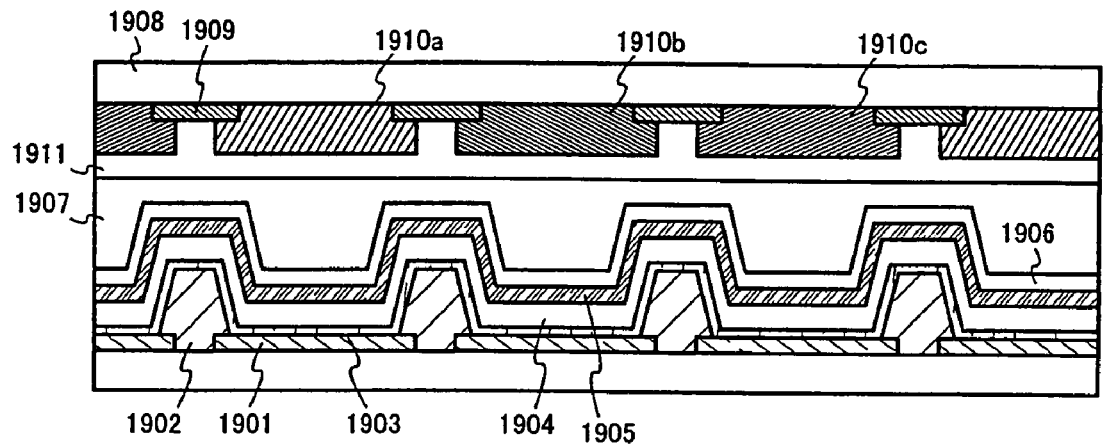
FIGS. 19A and 19B are views illustrating a constitution of the light-emitting device obtained by the invention.
Figure 19B:
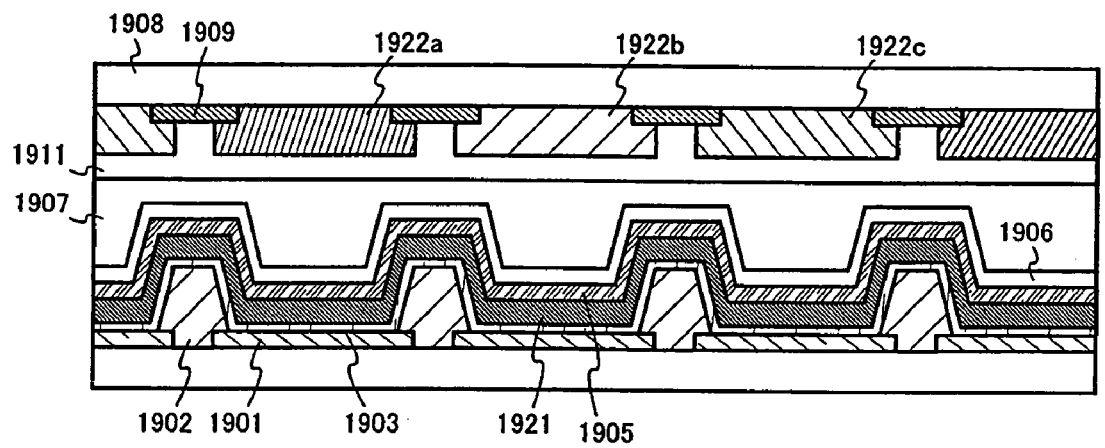

This embodiment deals with the light-emitting element of a different constitution in the light-emitting device described in the embodiment 13. The description refers to FIGS. 19A and 19B. FIG. 19A illustrates a system which uses a light-emitting layer for emitting white light that passes through color filters so as to be separated into three colors of red, green and blue. FIG. 19B illustrates a system which uses a light-emitting layer for emitting blue light that is converted through a color conversion layer (CCM) into three colors of red, green and blue.

In FIG. 19A, reference numeral 1901 is a pixel electrode. A titanium nitride film is used as the anode. An insulating film 1902 is formed so as to cover an end thereof, and a positive hole injection layer 1903 is formed thereon. A light-emitting layer 1904 that emits white light is formed on the positive hole injection layer 1903, and a cathode 1905 and a protection film 1906 are further formed thereon. The process for forming up to the protection film 1906 can be executed consistently by using the production apparatus of this invention.

Here, the light-emitting layer 1904 for emitting white light may be a known light-emitting layer using a polymeric organic compound such as the one obtained by dispersing a butyl-PBD (1,3,4-oxadiazole derivative) which is an electron-transporting material in a PVK (polyvinylcarbazole), and, further, adding a TPB (1,1,4,4-tetraphenyl-1,3-butadiene), a cumarin 6 and a DCMI (a styryl coloring matter) thereto as dopants.

The cathode 1905 can be formed to be transparent for the visible rays by laminating an Al—Li (alloy obtained by adding lithium to aluminum) electrode having a film thickness of about 20 to about 50 nm and an ITO (a compound of indium oxide and tin oxide) electrode.

Onto the light-emitting element is further stuck a color filter that also serves as a sealing member by using a resin (epoxy resin, etc.) 1907 for adhesion. The color filter is constituted by a support member 1908, a black mask 1909, a resin layer 1910a that permits the transmission of red light, a resin layer 1910b that permits the transmission of green light, a resin layer 1910c that permits the transmission of blue light, and an overcoat layer (flattening layer) 1911.

Being constituted as described above, white light emitted from the pixels is separated into red light, green light and blue light through the resin layer 1910a that permits the transmission of red light, through the resin layer 1910b that permits the transmission of green light and through the resin layer 1910c that permits the transmission of blue light, thereby to obtain colors.

FIG. 19B illustrates a constitution which basically resembles the constitution of FIG. 19A, but is provided, as a light-emitting layer, with a light-emitting layer 1921 that emits blue light, with a color conversion layer 1922a for converting blue light into red light instead of a color filter, with a color conversion layer 1922b for converting blue light into green light, and with a color conversion layer 1922c for converting the color of blue light in order to improve purity (the color conversion layer 1922c may not be provided).

Here, the light-emitting layer 1904 for emitting blue light may be a known light-emitting layer using a polymeric organic compound which may be a π-conjugated polymer such as a polydialkylfluorene derivative or a polyparaphenylene derivative. As the color conversion layers, there may be used a known fluorescent material excited with blue light.

Owing to the above constitution, blue light emitted from the pixels is converted into red light, green light and blue light through the color conversion layer 1922a, color conversion layer 1922b and color conversion layer 1922c to obtain colors.

The light-emitting device having light-emitting elements shown in FIGS. 19A and 19B can be produced by the production apparatus having the constitution of any one of the embodiments 1 to 11.

Embodiment 16

Figures 20A, 20B:
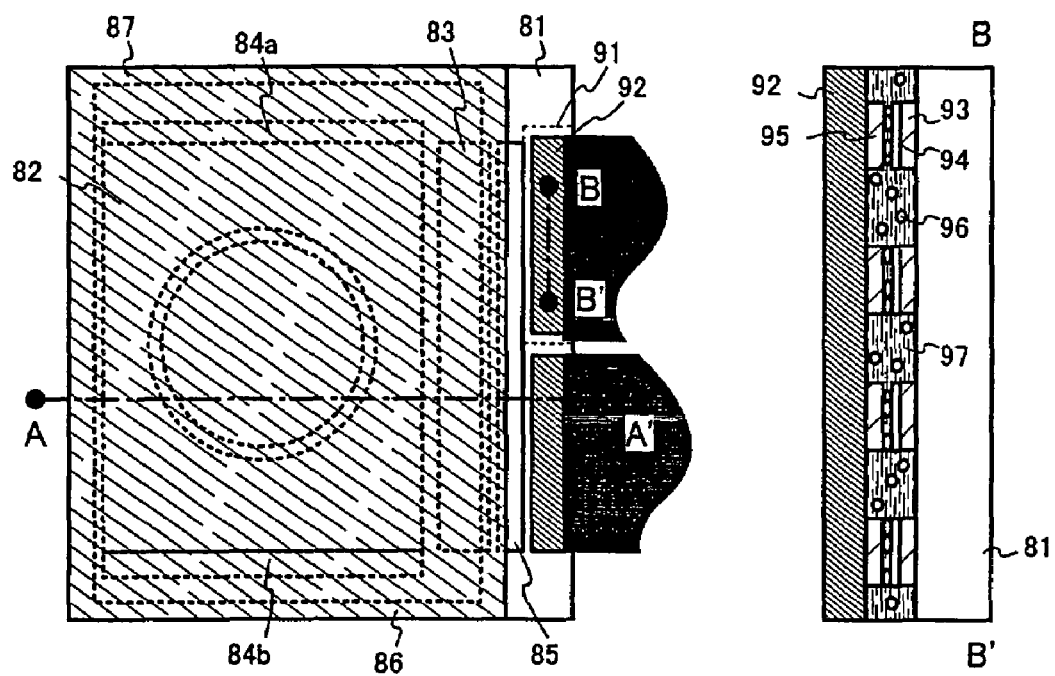
FIGS. 20A to 20C are views illustrating the appearance of the light-emitting device obtained by the invention.
Figure 20C:
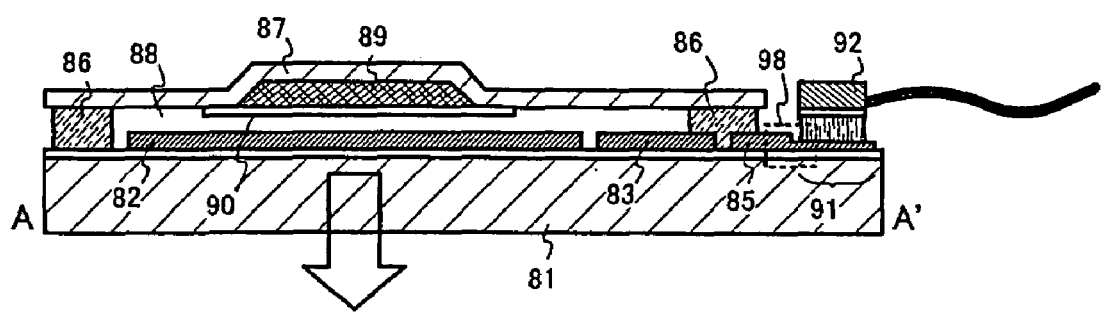

In the present embodiment, the constitution of the entire light emitting device obtained by implementing the present invention will be described with reference to FIGS. 20A to 20C. FIG. 20A is a top view of a light emitting device prepared by sealing a device substrate on which a thin film transistor is formed with a sealing material. FIG. 20B is a cross sectional view along the line of B-B' in FIG. 20A and FIG. 20C is a cross sectional view along the ling A-A' of FIG. 20A.

A pixel portion (display part) 82 is mounted on a substrate 81. In addition, a data line drive circuit 83, gate line drive circuits 84a and 84b, and a protective circuit 85 are arranged on the substrate 81 such that they surround the pixel portion 82. Furthermore, a sealing material 86 is provided such that it surrounds these structural components. The pixel portion 82 has light emitting elements obtained by implementing the present invention. The sealing material 86 may be an ultraviolet curing resin, an epoxy resin, or the like. Preferably, the sealing material may be a material with lowest possible hygroscopic property. By the way, the sealing material 86 may be formed such that it is piled up on part of the data line drive circuit 83, gate line drive circuits 84a and 84b, and a protective circuit 85, or may be provided such that it makes a detour to avoid these circuits.

Furthermore, a sealing substrate 87 is adhered on the substrate 81 through these components to form a sealed space 88 with the sealing material 86 and the sealing substrate 87. The sealing substrate 87 may be a glass material a metal material (typically, a stain steel material), a ceramic material, or a plastic material (including a plastic film). In addition, sealed only by an insulating film as shown in Embodiment 8 also is possible.

Furthermore, when a material which is different from the substrate 81 is used as the sealing substrate 87, there is a possibility of impairing the adhesion properties of the sealing material 86 as a result of the difference between their thermal expansion coefficients. Therefore, the sealing substrate 87 may be preferably the same material as that of the substrate 81 on which the transistor is formed. In other words, it is preferable to use a material having the same thermal expansion coefficient as that of the substrate 81. In this embodiment, glass is used as a material of the substrate 81 and the sealing substrate 87. In addition, the sealing substrate 87 may be subjected to the same heat history as that of the substrate 81 in the step of preparing a thin film transistor, so that their thermal expansion coefficients will be in close agreement with each other.

The sealing substrate 87 has a concave portion in which a moisture absorbent (e.g., barium oxide or calcium oxide) 89 is placed in advance to keep the closed space 88 under clear atmosphere by adsorbing water, oxygen, or the like. Thus, the sealing substrate 87 plays a role in the inhibition of deterioration of an EL layer. The concave portion is covered with a small-meshed cover material 90. In addition, air and water can pass through but the moisture absorbent 89 cannot. Furthermore, the closed space 88 may be filled with rare gas such as nitrogen or argon, or alternatively a resin or a liquid may be filled as far as it is inactive.

Furthermore, on the substrate 81, a terminal part 91 for transmitting signals to the data line drive circuit 83 and the gate line drive circuits 84a, 84b is formed. In addition, data signals such as video signals are transmitted to the terminal part 91 through a flexible print circuit (FPC) 92. The cross sectional view of the terminal part 91 is shown in FIG. 14B, in which a wiring having a structure in which an oxide conductive film 94 is piled up on a wiring 93 simultaneously formed with a gate wiring or a data wiring and a wiring 95 formed toward the FPC 92 are electrically connected to each other using a resin 97 in which particles of a conductive material 96 are dispersed. Here, the conductive material may be a spherical polymer compound coated with gold or silver plating.

In the present embodiment, the protective circuit 85 is placed between the terminal part 91 and the date drive circuit 83 and is responsible for releasing a pulse signal outside when the static electricity is caused by sudden pulse signals between them. Simultaneously, at first, a capacitor weakens a high voltage signal momentarily introduced, and other high voltage signals may be allowed to escape to the outside by a circuit constructed of a thin film transistor or a thin film diode. Alternatively, the protective circuit may be formed on other place, such as one between the pixel portion 82 and the gate line drive circuited 84a, 84b.

Embodiment 17

The structures of the thin film transistor described in Embodiments 13 and 14 all become a top-gate structure (specifically, planar structure). In each embodiment, however, a bottom-gate structure (typically, reverse stagger structure) can be adopted as well.

It should be understood that the application thereof is not limited to the thin film transistor but may be made of a MOS structure transistor formed by using silicon well. Further, instead of the thin film transistor, using a MIM (Metal-Insulator-Metal) element and the like represented by a diode (also referred as two terminals element) also is possible.

In any case, when an active matrix light emitting device is produced, the primary effect of the invention will not be impaired by the structure of switching elements such as the structure of transistors.

Embodiment 18

Electronic apparatuses can be produced by employing a light emitting device obtained by implementing the present invention to a display portion therein. Examples of the electronic apparatuses can be given as a video camera, a digital camera, a goggle type display (head mounted display), a navigation system, an audio reproducing apparatus (car audio, an audio component, and the like), a laptop computer, a game machine, a portable information terminal (a mobile computer, a cellular phone, a portable game machine, an electronic book, etc.), and an image reproducing apparatus including a recording medium (specifically, an apparatus capable of processing data in a recording medium such as a Digital Versatile Disk (DVD) and having a display that can display the image of the data). Practical examples thereof are shown in FIGS. 21A to 21H.

Figure 21A:
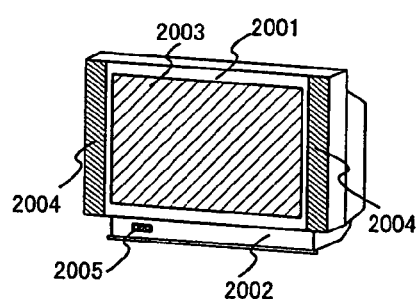
FIGS. 21A to 21H are views illustrating examples of electronic equipment provided with the light-emitting devices obtained by the invention.

FIG. 21A shows a television, which comprises a casing 2001, a supporting base 2002, a display portion 2003, speaker units 2004, a video input terminal 2005, etc. The present invention is applied to the display portion 2003. The term television includes every television for displaying information such as one for a personal computer, one for receiving TV broadcasting, and one for advertisement.

Figure 21B:
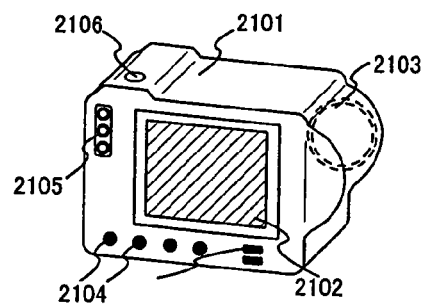

FIG. 21B shows a digital camera, which comprises a main body 2101, a display portion 2102, an image receiving unit 2103, operation keys 2104, an external connection port 2105, a shutter 2106, etc. The present invention is applied to the display portion 2102.

Figure 21C:
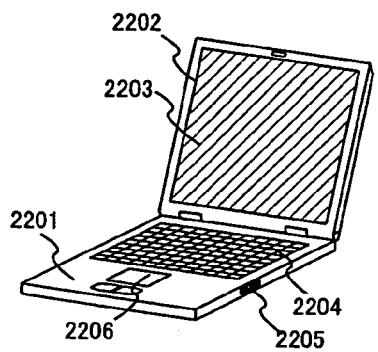

FIG. 21C shows a laptop computer, which comprises a main body 2201, a casing 2202, a display portion 2203, a keyboard 2204, an external connection port 2205, a pointing mouse 2206, etc. The present invention is applied to the display portion 2203.

Figure 21D:
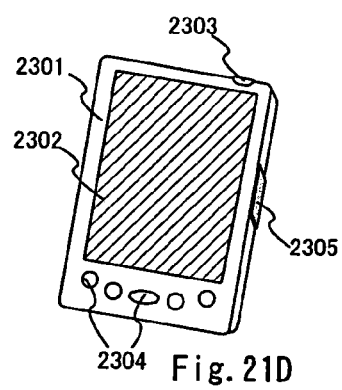

FIG. 21D shows a mobile computer, which comprises a main body 2301, a display portion 2302, a switch 2303, operation keys 2304, an infrared ray port 2305, etc. The present invention is applied to the display portion 2302.

Figure 21E:
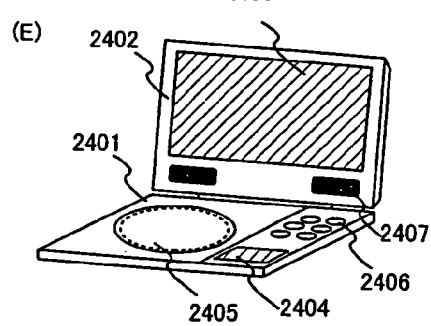

FIG. 21E shows a portable image reproducing apparatus equipped with a recording medium (a DVD player, to be specific). The apparatus comprises a main body 2401, a casing 2402, a display portion A 2403, a display portion B 2404, a recording medium (such as DVD) reading unit 2405, operation keys 2406, speaker units 2407, etc. The display portion A 2403 mainly displays image information whereas the display portion B 2404 mainly displays text information. The present invention is applied to the display portions A 2403 and B 2404. The term image reproducing apparatus equipped with a recording medium includes domestic game machines.

Figure 21F:
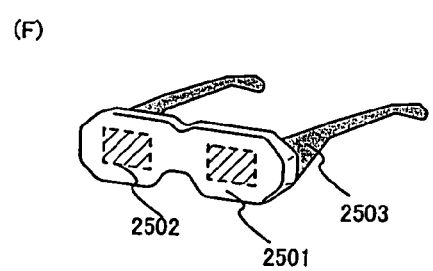

FIG. 21F shows a goggle type display (head mounted display), which comprises a main body 2501, display portions 2502, and arm units 2503. The present invention is applied to the display portion 2502.

Figure 21G:
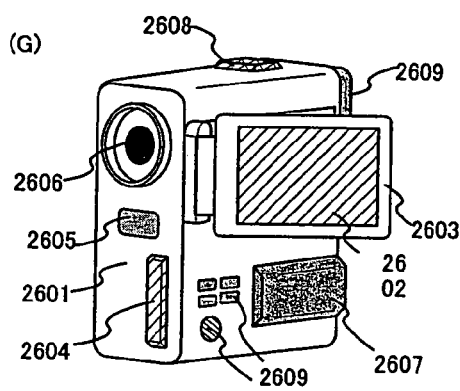

FIG. 21G shows a video camera, which comprises a main body 2601, a display portion 2602, a casing 2603, an external connection port 2604, a remote control receiving unit 2605, an image receiving unit 2606, a battery 2607, an audio input unit 2608, operation keys 2609 etc. The present invention is applied to the display portion 2602.

Figure 21H:
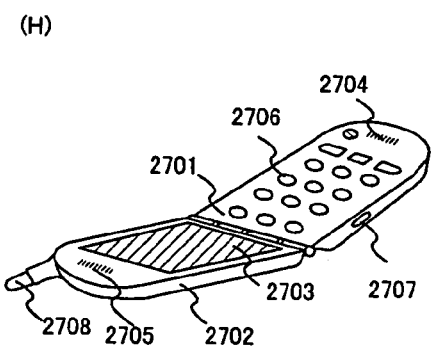

FIG. 21H shows a cellular phone, which comprises a main body 2701, a casing 2702, a display portion 2703, an audio input unit 2704, an audio output unit 2705, operation keys 2706, an external connection port 2707, an antenna 2708, etc. The present invention is applied to the display portion 2703. If the display portion 2703 displays white characters on a black background, power consumption of the cellular phone can be reduced.

As described above, the light emitting device obtained by implementing the present invention may be used as the display portions of any electronic apparatus. The electronic apparatuses of the present Embodiment may use any structure of the light emitting device shown in Embodiments 13 to 16.

The invention makes it possible to suppress the area occupied by means for conveying the substrates and, hence, to provide a production apparatus having a small footprint. The production apparatus having a small footprint facilitates laying out the devices in a clean room and designing the clean room.

What is claimed is;

1. An apparatus comprising:
 a loading chamber;
 a first chamber for forming a light-emitting film by a liquid jet method;
 a second chamber for forming a conductive film by a sputtering method;
 a third chamber for forming an insulating film by a sputtering method; and
 an unloading chamber,
 wherein a substrate is so supported that an angle subtended by a surface of the substrate to be treated and the direction of gravity is within from 0 to 30° in all of the loading chamber, the first chamber to the third chamber and the unloading chamber.

2. An apparatus according to claim 1, wherein the light-emitting film comprises at least one layer selected from the group consisting of a hole injection layer a hole-transporting layer, a hole-blocking layer, an electron injection layer, an electron-transporting layer and an electron-blocking layer.

3. An apparatus according to claim 1, wherein the conductive film is a metal film comprising an element belong to the Group 1 or the Group 2 of periodic table.

4. An apparatus according to claim 1, wherein the conductive film is an oxide conductive film.

5. An apparatus according to claim 1, wherein the insulating film comprises silicon nitride.

6. An apparatus according to claim 1, wherein the loading chamber and the unloading chamber are constituted as a unitary structure.

7. An apparatus comprising:
 a loading chamber;
 a common chamber;
 a first chamber for forming a light-emitting film by a liquid jet method;
 a second chamber for forming a conductive film by a sputtering method;
 a third chamber for forming an insulating film by a sputtering method; and
 an unloading chamber,
 wherein a substrate is so supported that an angle subtended by a surface of the substrate to be treated and the direction of gravity is within from 0 to 30° in all of the loading chamber, the common chamber, the first chamber to the third chamber and the unloading chamber.

8. An apparatus according to claim 7, wherein the light-emitting film comprises at least one layer selected from the group consisting of a hole injection layer a hole-transporting layer, a hole-blocking layer, an electron injection layer, an electron-transporting layer and an electron-blocking layer.

9. An apparatus according to claim 7, wherein the conductive film is a metal film comprising an element belong to the Group 1 or the Group 2 of periodic table.

10. An apparatus according to claim 7, wherein the conductive film is an oxide conductive film.

11. An apparatus according to claim 7, wherein the insulating film comprises silicon nitride.

12. An apparatus according to claim 7, wherein the loading chamber and the unloading chamber are constituted as a unitary structure.

13. An apparatus comprising:
a loading chamber;
a first chamber for forming a light-emitting film by a printing method;
a second chamber for forming a conductive film by a sputtering method;
a third chamber for forming an insulating film by a sputtering method; and
an unloading chamber,
wherein a substrate is so supported that an angle subtended by a surface of the substrate to be treated and the direction of gravity is within from 0 to 30° in all of the loading chamber, the first chamber to the third chamber and the unloading chamber.

14. An apparatus according to claim 13, wherein the light-emitting film comprises at least one layer selected from the group consisting of a hole injection layer a hole-transporting layer, a hole-blocking layer, an electron injection layer, an electron-transporting layer and an electron-blocking layer.

15. An apparatus according to claim 13, wherein the conductive film is a metal film comprising an element belong to the Group 1 or the Group 2 of periodic table.

16. An apparatus according to claim 13, wherein the conductive film is an oxide conductive film.

17. An apparatus according to claim 13, wherein the insulating film comprises silicon nitride.

18. An apparatus according to claim 13, wherein the loading chamber and the unloading chamber are constituted as a unitary structure.

19. An apparatus comprising:
a loading chamber;
a common chamber;
a first chamber for forming a light-emitting film by a printing method;
a second chamber for forming a conductive film by a sputtering method;
a third chamber for forming an insulating film by a sputtering method; and
an unloading chamber,
wherein a substrate is so supported that an angle subtended by a surface of the substrate to be treated and the direction of gravity is within from 0 to 30° in all of the loading chamber, the common chamber, the first chamber to the third chamber and the unloading chamber.

20. An apparatus according to claim 19, wherein the light-emitting film comprises at least one layer selected from the group consisting of a hole injection layer a hole-transporting layer, a hole-blocking layer, an electron injection layer, an electron-transporting layer and an electron-blocking layer.

21. An apparatus according to claim 19, wherein the conductive film is a metal film comprising an element belong to the Group 1 or the Group 2 of periodic table.

22. An apparatus according to claim 19, wherein the conductive film is an oxide conductive film.

23. An apparatus according to claim 19, wherein the insulating film comprises silicon nitride.

24. An apparatus according to claim 19, wherein the loading chamber and the unloading chamber are constituted as a unitary structure.

25. An apparatus comprising:
a loading chamber;
a first chamber for forming a light-emitting film by a spray method;
a second chamber for forming a conductive film by a sputtering method;
a third chamber for forming an insulating film by a sputtering method; and
an unloading chamber,
wherein a substrate is so supported that an angle subtended by a surface of the substrate to be treated and the direction of gravity is within from 0 to 30° in all of the loading chamber, the first chamber to the third chamber and the unloading chamber.

26. An apparatus according to claim 25, wherein the light-emitting film comprises at least one layer selected from the group consisting of a hole injection layer a hole-transporting layer, a hole-blocking layer, an electron injection layer, an electron-transporting layer and an electron-blocking layer.

27. An apparatus according to claim 25, wherein the conductive film is a metal film comprising an element belong to the Group 1 or the Group 2 of periodic table.

28. An apparatus according to claim 25, wherein the conductive film is an oxide conductive film.

29. An apparatus according to claim 25, wherein the insulating film comprises silicon nitride.

30. An apparatus according to claim 25, wherein the loading chamber and the unloading chamber are constituted as a unitary structure.

31. An apparatus comprising:
a loading chamber;
a common chamber;
a first chamber for forming a light-emitting film by a spray method;
a second chamber for forming a conductive film by a sputtering method;
a third chamber for forming an insulating film by a sputtering method; and
an unloading chamber,
wherein a substrate is so supported that an angle subtended by a surface of the substrate to be treated and the direction of gravity is within from 0 to 30° in all of the loading chamber, the common chamber, the first chamber to the third chamber and the unloading chamber.

32. An apparatus according to claim 31, wherein the light-emitting film comprises at least one layer selected from the group consisting of a hole injection layer a hole-transporting layer, a hole-blocking layer, an electron injection layer, an electron-transporting layer and an electron-blocking layer.

33. An apparatus according to claim 31, wherein the conductive film is a metal film comprising an element belong to the Group 1 or the Group 2 of periodic table.

34. An apparatus according to claim 31, wherein the conductive film is an oxide conductive film.

35. An apparatus according to claim 31, wherein the insulating film comprises silicon nitride.

36. An apparatus according to claim 31, wherein the loading chamber and the unloading chamber are constituted as a unitary structure.

* * * * *

UNITED STATES PATENT AND TRADEMARK OFFICE
CERTIFICATE OF CORRECTION

| | | |
|---|---|---|
| PATENT NO. | : 7,744,438 B2 | Page 1 of 2 |
| APPLICATION NO. | : 11/717815 | |
| DATED | : June 29, 2010 | |
| INVENTOR(S) | : Shunpei Yamazaki et al. | |

It is certified that error appears in the above-identified patent and that said Letters Patent is hereby corrected as shown below:

In The Drawings:

FIG. 7:

Change reference no. "75a" to -- 705a --;

FIG. 20A:

Replace the solid line above reference no. 84b, with a broken line.

In The Specification:

Column 5, Line 57, Change "materials," to -- materials. --;

Column 7, Line 26, Change "matrix substrate of" to -- matrix substrate on --;

Column 7, Line 65, Change "Treating" to -- heating --;

Column 8, Line 61, Change "clamber" to -- chamber --;

Column 10, Line 27, Change "FIGS." to -- FIG. --;

Column 11, Line 15, Change "ill" to -- in --;

Column 13, Line 23, Change "(pixels C)" to -- (pixels G). --;

Column 14, Line 62, Change "12D)." to -- 12D. --;

Column 19, Line 9, Change "FIG. 16," to -- FIG. 16. --;

Signed and Sealed this
Eighth Day of March, 2011

David J. Kappos
*Director of the United States Patent and Trademark Office*

CERTIFICATE OF CORRECTION (continued)
U.S. Pat. No. 7,744,438 B2

Column 23, Line 32, Change "elements" to -- element --;

Column 24, Line 4, Change "geranium." to -- germanium. --;

Column 24, Line 49, Change "DCMI" to -- DCM1 --;

Column 25, Line 58, After "material" (first occurrence) insert a -- , --;

Column 28, Line 10, Change "What is claimed is;" to -- What is claimed is: --.